United States Patent [19]

Higuchi et al.

[11] Patent Number: 5,783,492
[45] Date of Patent: Jul. 21, 1998

[54] PLASMA PROCESSING METHOD, PLASMA PROCESSING APPARATUS, AND PLASMA GENERATING APPARATUS

[75] Inventors: Kimihiro Higuchi; Chishio Koshimizu; Ryoichiro Koshi, all of Yamanashi-ken; Teruo Iwata, Nirasaki; Nobuo Ishii, Yamanashi-ken, all of Japan

[73] Assignee: Tokyo Electron Limited, Tokyo, Japan

[21] Appl. No.: 399,939

[22] Filed: Mar. 6, 1995

[30] Foreign Application Priority Data

Mar. 4, 1994 [JP] Japan ................. 6-060133
Mar. 14, 1994 [JP] Japan ................. 6-042402
Mar. 25, 1994 [JP] Japan ................. 6-079726

[51] Int. Cl.$^6$ .................................... H01H 1/00
[52] U.S. Cl. .................. 438/710; 438/485; 438/758; 438/788; 438/792; 427/569
[58] Field of Search ............... 427/569; 437/225; 156/643.1; 204/164; 438/710, 758, 485, 788, 792

[56] References Cited

U.S. PATENT DOCUMENTS

| | | |
|---|---|---|
| 4,877,650 | 10/1989 | Matsuyama et al. ............... 427/248.1 |
| 4,948,458 | 8/1990 | Ogle . |
| 5,226,967 | 7/1993 | Chen et al. . |
| 5,241,245 | 8/1993 | Barnes et al. . |
| 5,328,558 | 7/1994 | Kawamura .............. 156/643 |
| 5,456,796 | 10/1995 | Gupta et al. ............ 156/643.1 |
| 5,478,429 | 12/1995 | Komino et al. .......... 156/345 |

FOREIGN PATENT DOCUMENTS

| | | |
|---|---|---|
| 0 379 828 | 8/1990 | European Pat. Off. . |
| 2-235332 | 9/1990 | Japan . |
| 3-79025 | 4/1991 | Japan . |
| 4-290428 | 10/1992 | Japan . |
| 5-206072 | 8/1993 | Japan . |

*Primary Examiner*—Charles L. Bowers, Jr.
*Assistant Examiner*—Matthew Whipple
*Attorney, Agent, or Firm*—Oblon, Spivak, McClelland, Maier & Neustadt, P.C.

[57] ABSTRACT

A plasma processing method of performing plasma processing such as plasma film formation processing on a target object arranged in a processing vessel is disclosed. This method includes the first step of introducing an inert gas into the processing vessel, the second step of generating a plasma of the inert gas in the processing vessel, the third step of introducing a processing gas for processing the target object into the processing vessel, and the fourth step of generating a plasma of the processing gas in the processing vessel to process the target object.

10 Claims, 11 Drawing Sheets

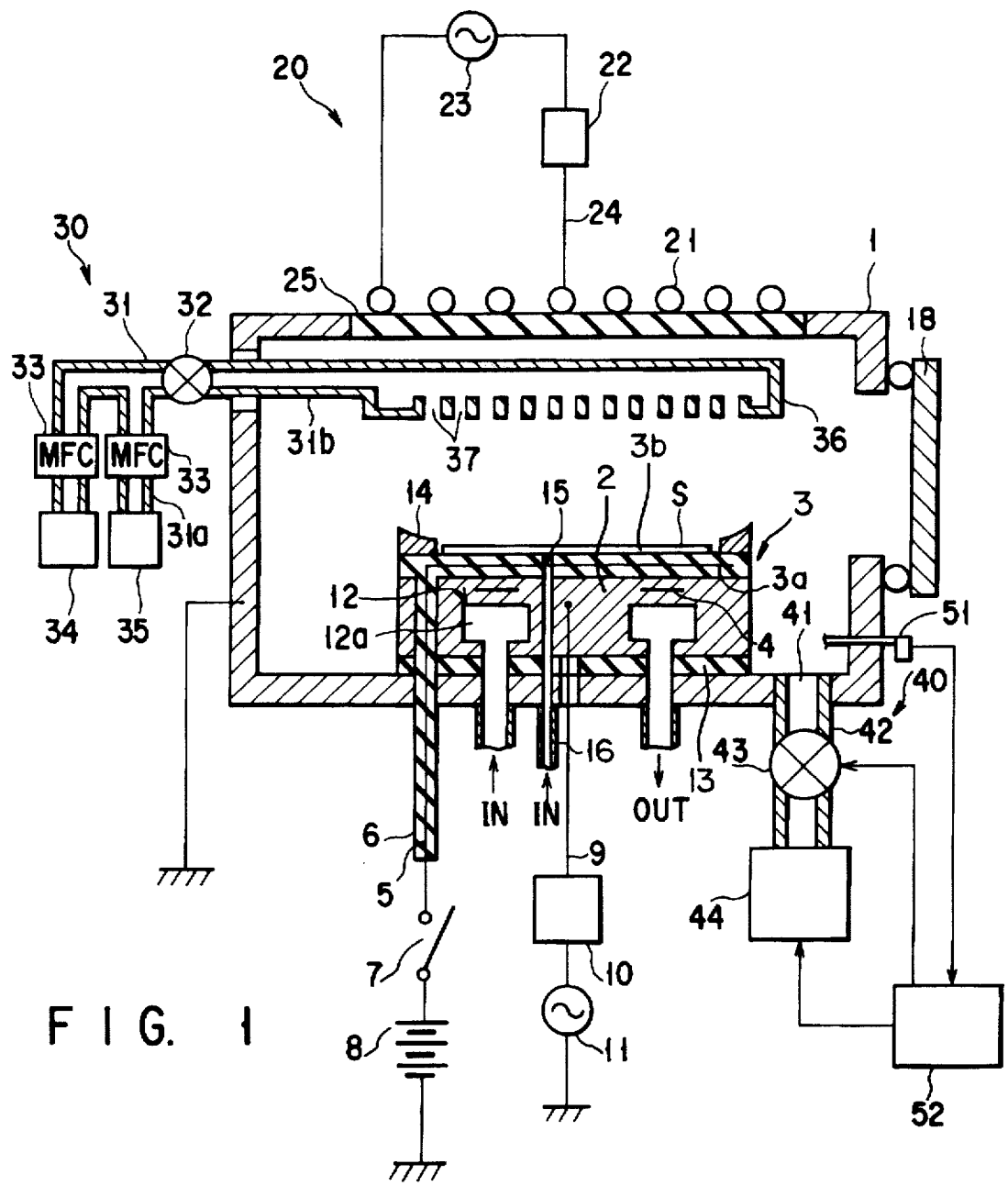
F I G. 1
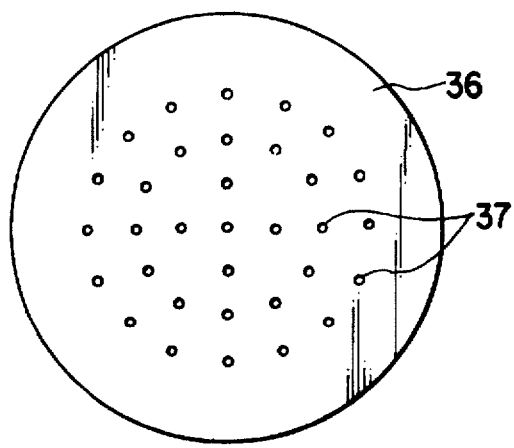
F I G. 2

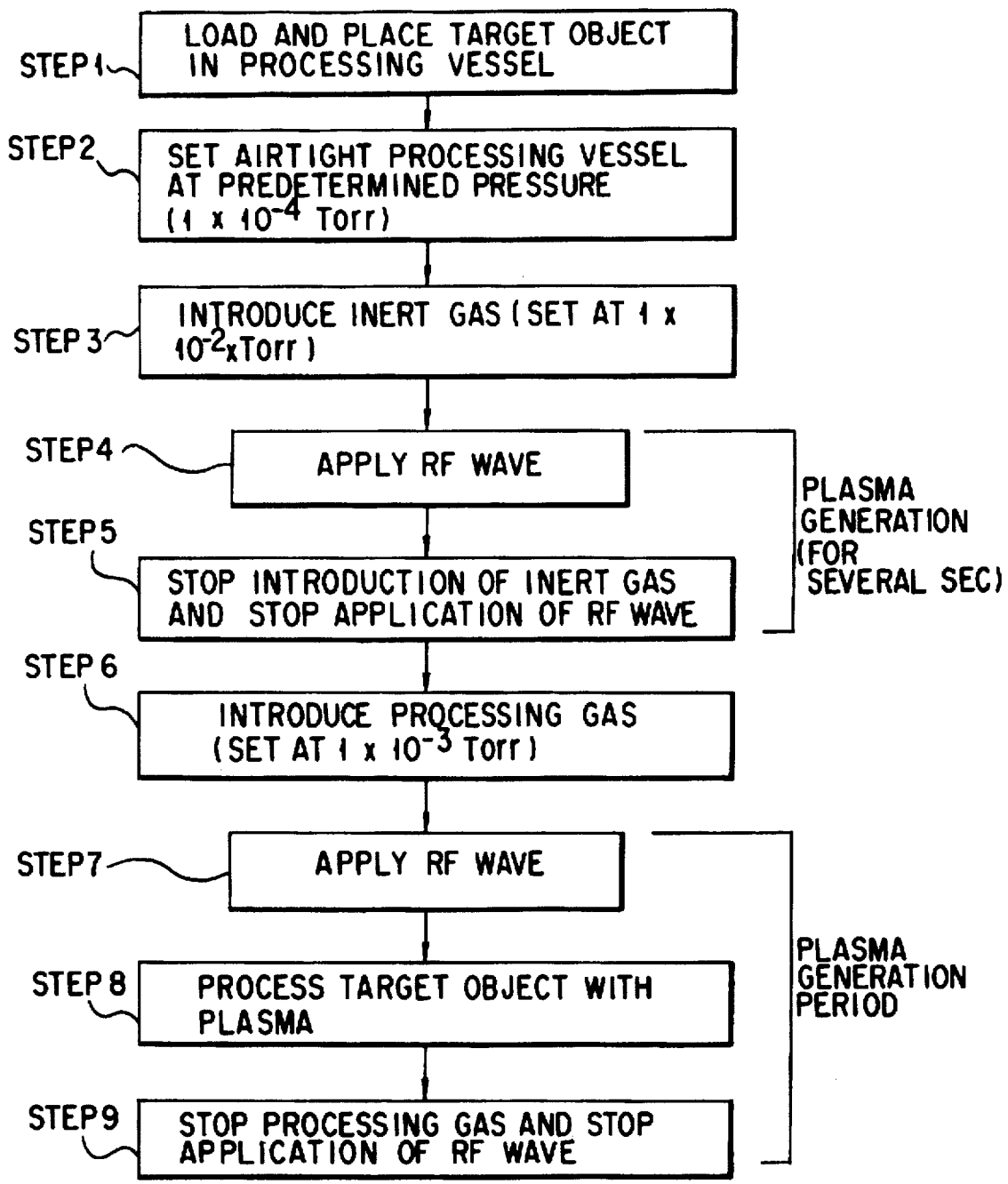
F I G. 5

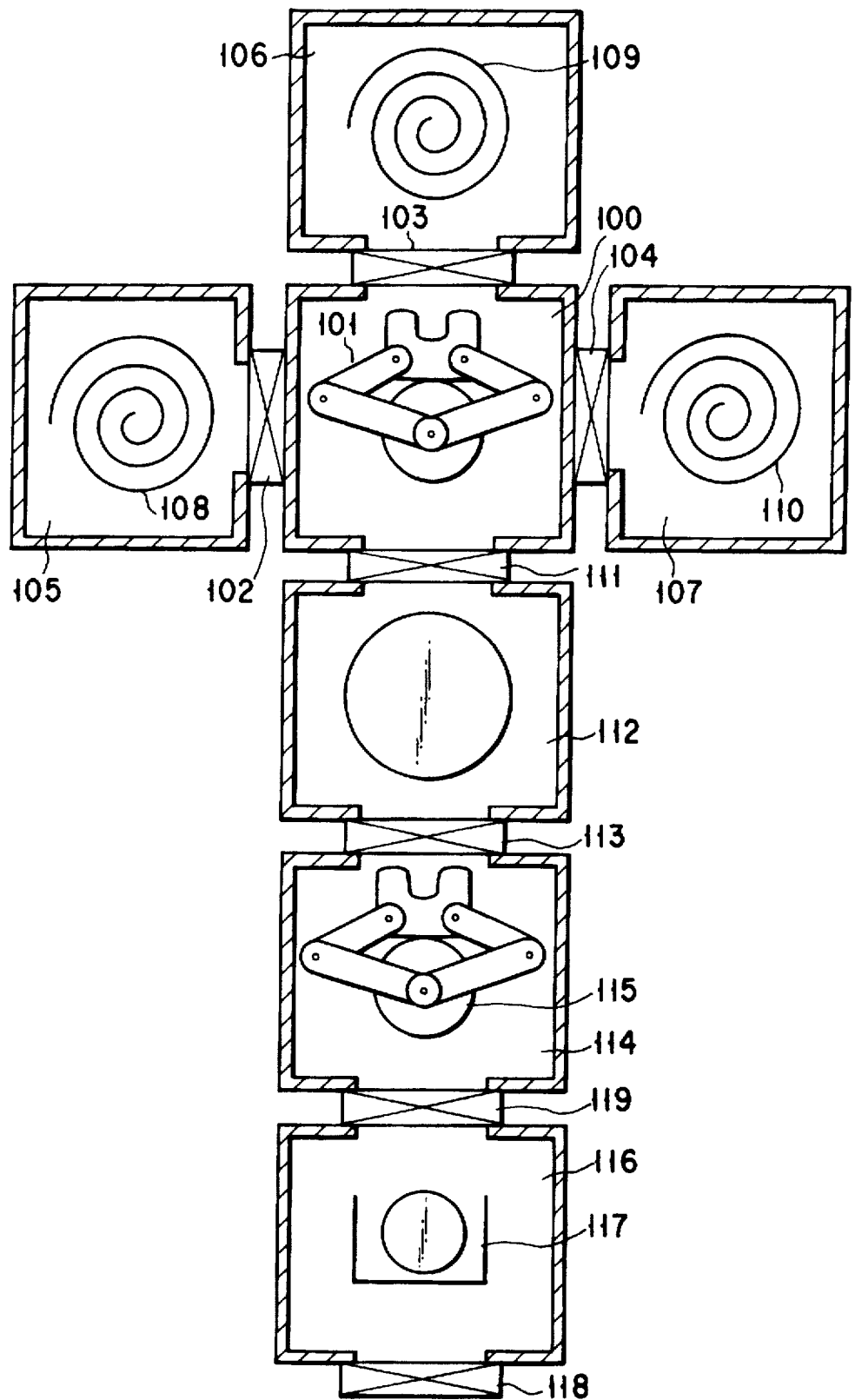
F I G. 8

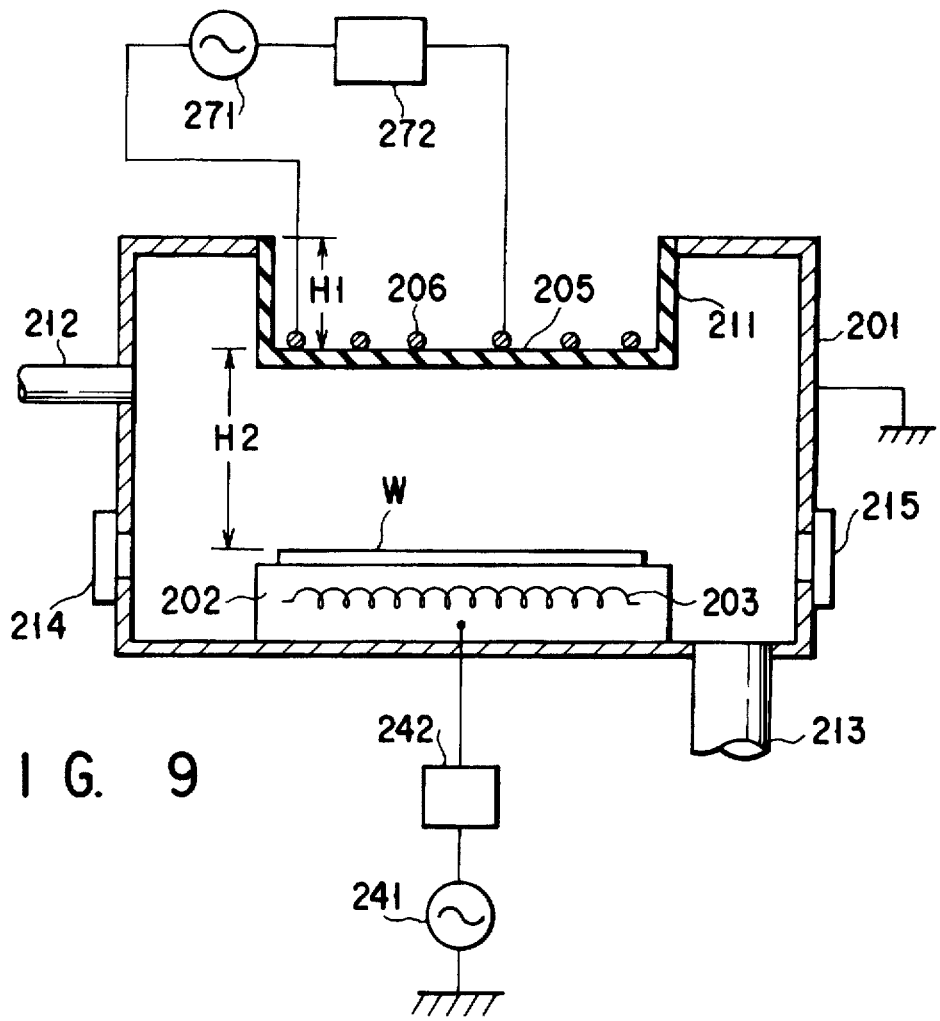
F I G. 9
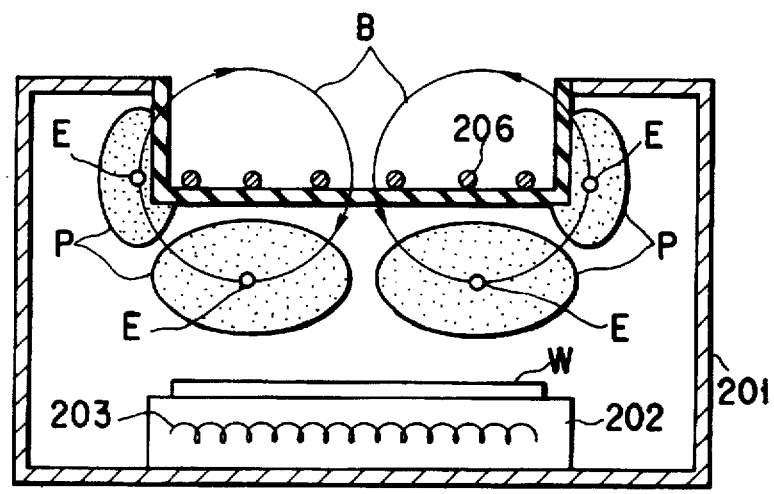
F I G. 10

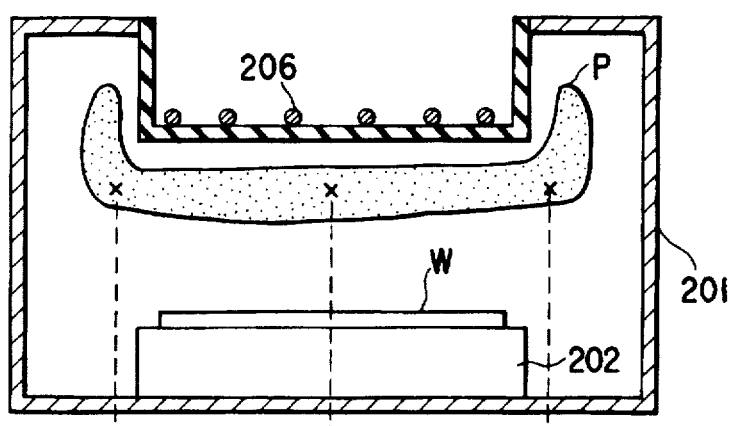
FIG. 11A
FIG. 11B
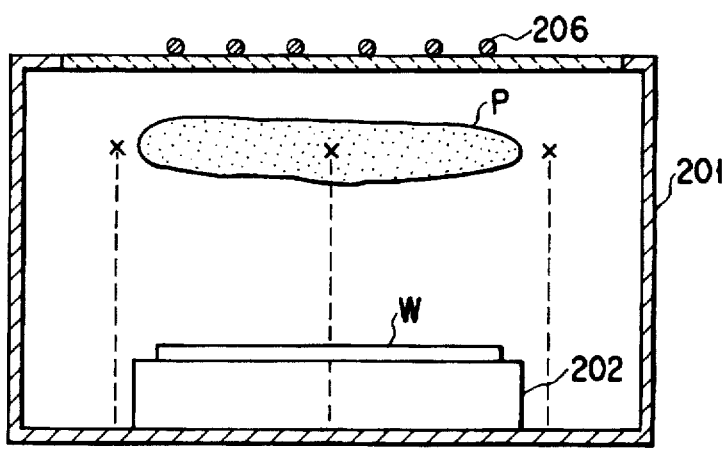
FIG. 12A
(PRIOR ART)
FIG. 12B
(PRIOR ART)

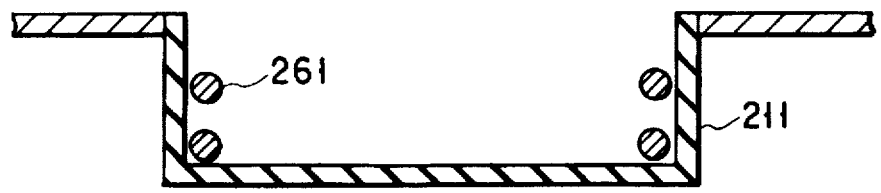
F I G. 13
F I G. 14
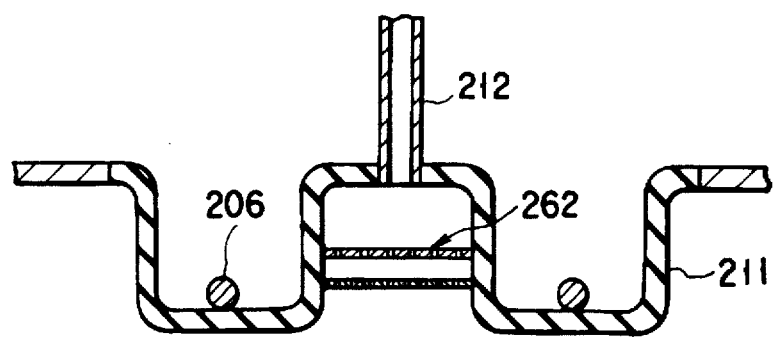
F I G. 15

PLASMA PROCESSING METHOD, PLASMA PROCESSING APPARATUS, AND PLASMA GENERATING APPARATUS

BACKGROUND OF THE INVENTION

1. Field of the Invention

The present invention relates to a plasma processing method, a plasma processing apparatus, and a plasma generating apparatus.

2. Description of the Related Art

Generally, a technique of performing film formation or etching by processing, with a plasma, a substrate on which a thin film transistor for a semiconductor wafer or a liquid crystal display substrate is to be formed has been used.

As a typical conventional apparatus for generating a plasma, a parallel-plate plasma processing apparatus has been known. The pressure in this apparatus during generation of a plasma is 100 mTorr to 1 Torr, and the ion mean free path is short at such a high pressure, resulting in difficult micropatterning. Further, in this apparatus, high uniformity in plasma distribution cannot be assured over a wide area. For this reason, a method of generating a plasma in accordance with an RF induction system has been recently studied in place of the above apparatus.

This method of generating a plasma in accordance with the RF induction system is disclosed in, e.g., European Pat. Appln. Publication No. 379,828, Jpn. Pat. Appln. KOKAI Publication Nos. 2-235332, 3-79025, 4-290428, and 5-206072. As disclosed in these references, the upper surface of a chamber opposite to a wafer table formed of a dielectric member such as a silica glass. A planar coil is arranged outside this dielectric member, and an RF current is supplied to this coil to form an electromagnetic field in the chamber. Electrons flowing through this electromagnetic field are collided against neutrons of a processing gas to ionize the gas, thereby generating a plasma.

According to this method, a concentric electric field is induced in accordance with the shape of the coil, so a plasma is effectively confined. Compared to the parallel-plate plasma processing apparatus, a plasma can be generated at a very low pressure, and theoretically in a vacuum of $10^{-6}$ Torr at most. The ion mean free path in the generated plasma becomes long, thereby obtaining a high-density and uniform plasma.

Actually, in the plasma processing apparatus for generating a plasma by applying an RF voltage to this induction means, a plasma can be easily generated in a pressure range of $1 \times 10^{-3}$ Torr to several Torr, but it is difficult to properly generate a plasma at a pressure lower than this pressure range.

For this reason, the following method of processing a target object with a plasma is employed. According to this method, when a processing gas for processing a target object is to be introduced into a processing vessel, the pressure in the processing vessel is set to be a relatively high pressure on, e.g., a $10^{-2}$ Torr order to generate a plasma. Then, the interior of the processing vessel is evacuated to lower its pressure to, e.g., an $10^{-3}$ Torr order. At this pressure, the target object is processed with a plasma.

According to this method, however, the pressure in the processing vessel is varied in a state of generating a plasma of the processing gas during introduction of the processing gas to stabilization of plasma generation. Since this pressure variation affects the plasma processing results of the target object, the processing results differ in target objects, and the reproducibility is degraded. That is, plasma stabilization at a rise of a plasma of the processing gas for processing the target object greatly affects the processing results of the target object. For this reason, if the rise time of a plasma in an unstable processing gas is prolonged, the processing results undesirably differ in target objects, or the uniformity on one target object is degraded.

In recent years, high integration of semiconductor devices formed on a semiconductor wafer has been achieved. For example, the capacity of a memory chip is advanced from a 16-M DRAM to a 64-M DRAM and further a 256-M DRAM, and the design rule is reduced from 0.5 μm to 0.25 μm. With this development, it is strongly demanded that plasma processing is performed at a lower pressure of, e.g., $1 \times 10^{-2}$ Torr to $1 \times 10^{-6}$ Torr to realize micropatterning. A method of generating a plasma at such a low pressure and an apparatus therefor must be developed.

More specifically, the following plasma processing method and plasma processing apparatus are required. According to the plasma processing method and the plasma processing apparatus, the electron mean free path is increased by setting a vacuum pressure low. Components, perpendicular to a target object, of ions or active species in a plasma which are drawn in the target object are effectively used. With this operation, for example, when a contact hole is to be formed by using etching processing, plasma processing in which the etching processing rate is higher in a direction of depth than in a direction parallel to the surface of the target object can be performed at the port of the contact hole.

In addition to micropatterning of a pattern, the size of a wafer is increased from 8 inch to 12 inch. In this condition, processing of, e.g., uniformly burying a pattern over a wide area is required. In order to meet this demand, the generation density distribution of a plasma in a chamber must be further uniformed. In the above plasma processing apparatus using the RF induction system, a plasma is generated in the chamber space immediately below the coil. The plasma generation density is almost proportional to the electric field strength at each position. This plasma generation density is slightly low at the central position, but substantially uniform at the intermediate portion of the coil.

However, the plasma density is reduced outward near the peripheral edge portion of the coil with a very large gradient. This is because a plasma of the processing gas is not generated sideward from the coil. Therefore, in the plasma processing apparatus, the plasma density near the central portion of a wafer tends to be higher than that near the peripheral edge portion of the wafer. It is difficult to increase the uniformity in plasma processing.

The size of a coil may be increased to uniform the plasma density above a wafer. However, with the increase in size of the coil, an electrode provided to the coil and also a silica glass disposed on the upper surface of a chamber are increased, resulting in high cost. If processing of an LCD substrate by using the same apparatus is also taken into consideration, the size of this apparatus is further increased because the LCD substrate has a large size of 600 mm×600 mm. This large-sized apparatus causes an increase in cost. Therefore, practicability of the large-sized coil is poor.

SUMMARY OF THE INVENTION

The present invention has been made in consideration of the above situation, and has as its object to provide a plasma processing method by which the rise of a plasma can be stabilized and plasma processing can be performed at a low pressure, and a plasma processing apparatus therefor.

It is another object of the present invention to provide a plasma generating apparatus which can generate a uniform plasma over a wide region.

It is still another object of the present invention to provide a plasma processing apparatus in which plasma processing, e.g., film formation processing can be highly uniformly performed on a target object.

According to the first aspect of the present invention, there is provided a plasma processing method of processing a target object arranged in a processing vessel with a plasma, comprising:

a first step of introducing an inert gas into the processing vessel;

a second step of generating a plasma of the inert gas in the processing vessel;

a third step of introducing a processing gas for processing the target object into the processing vessel; and a fourth step of generating a plasma of the processing gas in the processing vessel to process the target object.

According to the second aspect of the present invention, there is provided a plasma processing method of processing a target object arranged in a processing vessel with a plasma, comprising:

a first step of introducing an inert gas into the processing vessel;

a second step of generating a plasma of the inert gas in the processing vessel;

a third step of stopping the plasma of the inert gas;

a fourth step of introducing a processing gas for processing the target object into the processing vessel; and a fifth step of generating a plasma of the processing gas in the processing vessel to process the target object.

According to the third aspect of the present invention, there is provided a plasma processing method of processing a target object arranged in a processing vessel with a plasma, comprising:

a first step of introducing an inert gas into the processing vessel;

a second step of generating a plasma of the inert gas in the processing vessel; and a third step of introducing a processing gas for processing the target object into the processing vessel to generate a plasma of the processing gas while keeping introduction of the inert gas and generation of the plasma, thereby processing the target object.

According to the fourth aspect of the present invention, there is provided a plasma processing apparatus for processing a target object with a plasma, comprising:

a processing vessel for accommodating the target object;

exhaust means for exhausting an interior of the processing vessel;

inert gas introduction means for introducing an inert gas into the processing vessel;

inert gas plasma generation means for generating a plasma of the inert gas;

processing gas introduction means for introducing a processing gas for processing the target object into the processing vessel; and processing gas plasma generation means for generating a plasma of the processing gas for processing the target object.

According to the fifth aspect of the present invention, there is provided a plasma generating apparatus, comprising:

a processing vessel having a recessed portion on a wall portion thereof;

gas introduction means for introducing a gas into the processing vessel; and an induction member, arranged in the recessed portion, for forming an electric field in the processing vessel by electromagnetic induction caused by applying an RF voltage, wherein a plasma of the gas is generated in the processing vessel by the electric field formed by the induction member.

According to the sixth aspect of the present invention, there is provided a plasma generating apparatus, comprising:

a processing vessel, having a recessed portion on a wall portion thereof, for accommodating a target object;

gas introduction means for introducing a processing gas into the processing vessel; and an induction member, arranged in the recessed portion, for forming an electric field in the processing vessel by electromagnetic induction caused by applying an RF voltage, wherein a plasma of the processing gas is generated in the processing vessel by the electric field formed by the induction member, thereby processing the target object.

According to the seventh aspect of the present invention, there is provided a plasma generating apparatus, comprising:

a processing vessel, having a recessed portion on a wall portion thereof, for accommodating a target object;

gas introduction means for introducing a film formation gas into the processing vessel; and a coil, arranged in the recessed portion, for forming an electric field in the processing vessel by electromagnetic induction caused by applying an RF voltage, wherein a plasma of the film formation gas is generated in the processing vessel by the electric field formed by the coil, thereby performing film formation processing on the target object.

BRIEF DESCRIPTION OF THE DRAWINGS

FIG. 1 is a sectional view showing an embodiment of a plasma processing apparatus for executing a plasma processing method of the present invention;

FIG. 2 is a bottom view showing a shower head for gas introduction used in the plasma processing apparatus of FIG. 1;

FIG. 5 is a flow chart showing an embodiment of a plasma processing method of the present invention;

FIG. 8 is a schematic view showing a cluster tool processing unit in which the plasma processing apparatus for executing the plasma processing method of the present invention is installed;

FIG. 9 is a schematic view showing a film forming apparatus to which another embodiment of a plasma generating apparatus of the present invention is applied;

FIG. 10 is a view for explaining the operation of the apparatus in FIG. 9;

FIG. 11A is a view showing a state of a plasma generated in the apparatus of FIG. 9;

FIG. 11B is a graph showing the electron density distribution in a processing vessel obtained when a plasma is generated in the apparatus of FIG. 9;

FIG. 12A is a view showing a state of a plasma generated in a conventional plasma film forming apparatus;

FIG. 12B is a graph showing the electron density distribution in a processing vessel obtained when a plasma is generated in the conventional plasma film forming apparatus;

FIG. 13 is a view showing another induction member used in the apparatus of FIG. 9;

FIGS. 14 and 15 are views showing other shapes of a recessed portion in the apparatus of FIG. 9;

DETAILED DESCRIPTION OF THE PREFERRED EMBODIMENTS

Figure 3:
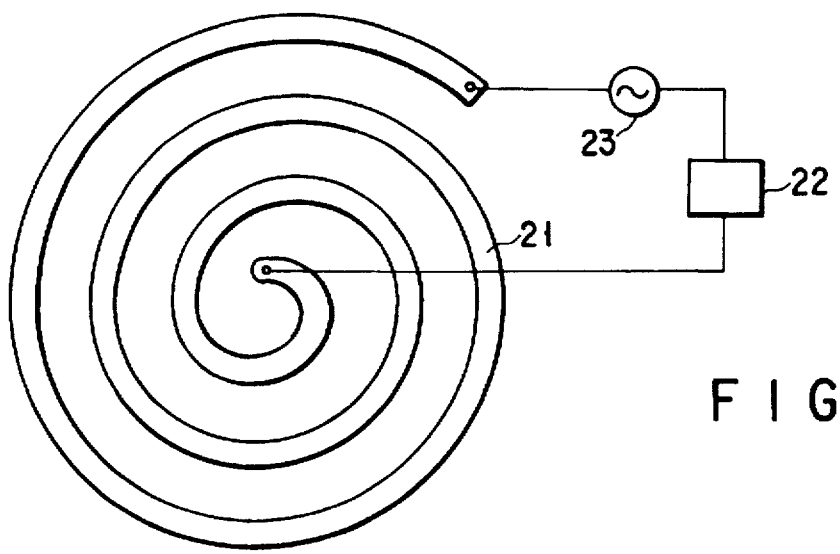
FIGS. 3 and 4 are views showing other induction members used in the plasma processing apparatus of FIG. 1.

Preferred embodiments of the present invention will be described below with reference to the accompanying drawings.

FIG. 1 is a sectional view showing an embodiment of a plasma processing apparatus for executing a plasma processing method of the present invention.

This apparatus comprises a processing vessel 1, a table 2 for placing a target object in the processing vessel 1, an induction means 20 arranged above the processing vessel 1, a gas supply mechanism 30 for supplying an inert gas and a processing gas into the processing vessel 1, and an exhaust mechanism 40 for exhausting the interior of the processing vessel 1.

The processing vessel 1 has an airtight structure and is formed of a conductor such as aluminum. In order to obtain a shielding effect, the processing vessel 1 is electrically grounded. An oxide film as an insulating film is formed on the inner wall surface of aluminum.

The table 2 for placing a target object S is disposed at the central portion of the processing vessel 1. The table 2 is formed of a conductor such as aluminum, and an oxide film as an insulator is formed on its surface. An insulating table 13 constituted by, e.g., a ceramic plate is provided between the table 2 and the bottom wall of the processing vessel 1 to electrically insulate the table 2 and the processing vessel 1.

An electrostatic chuck 3 for electrostatically chucking the target object S is arranged on the table 2. The electrostatic chuck 3 has a structure in which a polyimide insulating films 3b sandwich a copper foil 3a. A DC power supply 8 is connected to the copper foil 3a via a wiring 5. The DC power supply 8 applies a DC voltage of, e.g., 2 kV to the electrostatic chuck 3 to chuck and hold the target object S during plasma processing. The wiring 5 is surrounded by an insulator 6, and a switch 7 is provided midway along the wiring 5.

For example, the target object S comprises an 8 inch or 12 inch diameter semiconductor wafer, and a 600×600 mm-rectangular glass substrate for forming thin film transistors which constitute a liquid crystal display apparatus. The target object S is loaded into the processing vessel 1 by a convey unit (not shown), and placed on the table 2.

An openable gate valve 18 is formed in the side wall of the processing vessel 1. The target object S is loaded/unloaded into/from the processing vessel 1 while the gate valve 18 is kept open.

An RF power supply 11 is connected to the table 2 via a matching circuit 10 using a wiring 9. By an RF current of, e.g., several hundreds KHz supplied from the RF power supply 11, the table 2 has a function of vertically drawing, in the target object S, ions or active species in a plasma generated by an induction means (to be described later), thereby increasing the plasma processing speed.

In order to keep the target object S at a predetermined temperature during plasma processing, a temperature adjustment mechanism 12 is arranged in the table 2. The temperature adjustment mechanism 12 controls the temperature by circulating a medium whose temperature is adjusted through a passage 12a in the table 2. As a medium used for the temperature adjustment mechanism 12, water, an antifreeze, or the like whose temperature is adjusted is used at a temperature of 0° C. to room temperature; and temperature-adjusted liquid nitrogen is used at a low temperature of −180° C. to +10° C. In order to increase the temperature adjustment accuracy, a ceramic heater 4 as a heating member is buried in the table 2. Temperature adjustment is performed by controlling the temperature adjustment mechanism 12 and the heater 4 in response to feedback of a detection signal from a thermocouple (not shown) buried near the target object placing surface of the table 2.

Three vertically movable pusher pins (not shown) are provided to the table 2. These pusher pins are moved upward through the electrostatic chuck 3 to receive the target object S in this state. By moving these pusher pins downward, the target object S is placed at a predetermined position of the electrostatic chuck 3.

A back cooling gas supply pipe 16 is provided such that it vertically extends through the central portion of the table 2, and a through hole 15 is formed in the electrostatic chuck 3 so as to communicate with the supply pipe 16. While the target object S is placed on the electrostatic chuck 3, a back cooling gas, e.g., an He gas is supplied from a back cooling gas supply source (not shown) to a very small space between the target object S and the electrostatic chuck 3 via the supply pipe 16 and the through hole 15. With this operation, heat is efficiently transferred from the table 2 to the target object S subjected to plasma processing in a vacuum atmosphere. The degree of heat transfer by this back cooling gas is mainly determined by the pressure of the back cooling gas. For this reason, an adjustment mechanism (not shown) is provided to properly adjust the gas pressure.

A doughnut-like focus ring 14 is arranged on the electrostatic chuck 3 so as to surround the target object placing region. The focus ring 14 has a height larger than the thickness of the target object, and is formed of a dielectric, e.g., quartz. The focus ring 14 has a function of concentrating a plasma on the surface of the target object to increase the efficiency of plasma processing.

The exhaust mechanism 40 comprises an exhaust pipe 42 connected to an exhaust port 41 formed in the bottom surface of the processing vessel 1, and an exhaust unit 44 connected to the exhaust pipe 42. By operating the exhaust unit 44, the interior of the processing vessel 1 is evacuated to set its interior at a predetermined vacuum pressure of, e.g., several Torr to $1 \times 10^{-8}$ Torr. By a valve 43 provided midway along the exhaust pipe 42, this exhaust operation is started/stopped, and the exhaust amount is adjusted. The exhaust unit 44 comprises a dry pump and a turbo-molecular pump. First, the interior of the processing vessel 1 is evacuated by the dry pump until the pressure becomes lower than a predetermined value. Then, the dry pump is switched to the turbo-molecular pump to evacuate the interior of the processing vessel 1.

The gas supply mechanism 30 comprises a processing gas supply source 34, an inert gas supply source 35, a shower head 36 provided immediately above the table 2, and a pipe 31 for connecting the gas supply sources 34 and 35 and the shower head 36.

The shower head 36 is formed of a dielectric, e.g., quartz so as not to adversely affect an electromagnetic field generated by the induction means (to be described later). The shower head 36 is arranged to oppose the target object S placed on the table 2. As shown in FIG. 2, a large number of injection holes 37 are formed in the surface of the shower head 36 opposite to the target object S. A processing gas or an inert gas is supplied from the processing gas supply source 34 or the inert gas supply source 35 to the shower head 36 via the pipe 31 and injected from the injection holes 37 toward the target object S. The surface in which the injection holes 37 of the shower head 36 are formed has an area larger than the target surface the target object S. Each injection hole 37 has a diameter of 0.5 to 2 mm, and an interval between adjacent injection holes is 2 to 10 mm. By using the shower head 36 having such a structure, a processing gas and an inert gas are uniformly supplied toward the surface of the target object S.

The pipe 31 between the gas sources 34 and 35 and the shower head 36 is constituted by individual pipes 31a connected to the corresponding gas sources and a common pipe 31b to which the individual pipes 31a are coupled. Mass-flow controllers 33 are respectively provided to the two individual pipes 31a, and a valve 32 is provided to the common pipe 31b.

An inert gas supplied from the inert gas supply source 35 is, e.g., Ar (argon), Xe (xenon), $N_2$ (nitrogen), or He (helium). One type or several types of processing gases are supplied from the processing gas supply source 34 in correspondence with the contents of plasma processing with respect to the target object S. When the plasma processing is plasma etching, e.g., a $CHF_3$ gas is supplied; and when the plasma processing is plasma film formation, e.g., an $SiH_4$ gas is supplied.

In many cases of a 256-k DRAM to a 1-M DRAM, for example, a $WSi_x$ film formed by the CVD is used for a gate electrode and a bit line wiring layer. The $WSi_x$ film as a refractory metal silicide having a low electric resistance is used for a 4-M DRAM or a DRAM having a larger capacity than the 4-M DRAM. In this case, processing gases can be properly selected and combined in accordance with purposes of, e.g., forming a low-temperature $WSi_x$ film using an $SiH_4$ gas as a processing gas, or a high-temperature $WSi_x$ film using an $SiH_2Cl_2$ gas as a processing gas.

In the above case, an inert gas from the inert gas supply source 35 and a processing gas from the processing gas supply source 34 are supplied to the shower head 36 via the common pipe 31b. In place of this arrangement, they can be supplied to the shower head 36 via independent pipes, respectively.

The upper wall portion of the processing vessel 1 opposite to the table 2 is formed of a dielectric member 25 as an insulator. The induction means 20 is provided immediately above the dielectric member 25 outside the processing vessel 1.

The dielectric member 25 is formed of a material, e.g., quartz so as not to adversely affect an electromagnetic field formed by the induction means 20. The dielectric member 25 has an area 10% to 100% larger than the target surface of the target object S, and covers the target surface in the opposite region where the surface to be processed is placed. The dielectric member 25 may be one which can control an electromagnetic field, as needed. An electromagnetic field formed by the induction means 20 is controlled to be uniformed at, e.g., its central and peripheral portions. The electromagnetic field must have a shape enough to stably maintain a generated plasma.

The dielectric member 25 is formed of a quartz plate having a thickness of, e.g., 30 to 50 mm such that the dielectric member 25 stands a pressure which affects the dielectric member 25 when the interior of the processing vessel 1 is reduced. If the dielectric member 25 does not stand a difference between the pressure in the processing vessel 1 and the atmospheric pressure, vacuum chambers may be provided to the both sides of the dielectric member 25 to decrease the pressure difference.

The induction means 20 forms an electric field in the processing vessel 1 by electromagnetic induction. The induction means 20 comprises an induction member 21 having, e.g., a coiled shape, an RF power supply 23 for supplying an RF power to the induction member 21 via a wiring 24, and a matching circuit 22 provided midway along the wiring 24.

Figure 4:
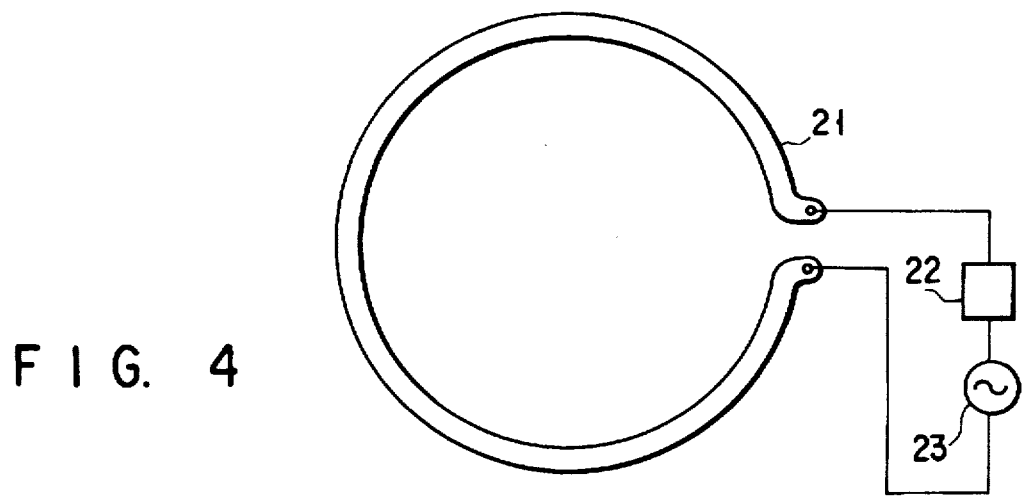

As shown in FIG. 3, a substantially planar coil is suitable for the induction member 21, and the number of turns is properly set in accordance with a frequency. A copper plate having a thickness of 1 to 5 mm, or a copper pipe having an outer diameter of 3 to 5 mm and an inner diameter of 1 to 4 mm is formed into a coiled shape, and the obtained member can be used as the substantially planar coil. The induction member 21 may have a ring-like shape, as shown in FIG. 4. In addition, the induction member 21 may have a spiral shape, a linear shape, or the like.

When an RF power is supplied to the induction member 21, an alternating magnetic field is generated around the induction member 21. By electromagnetic induction caused by this alternating field, an alternating electric field is generated in the processing vessel 1 to generate a plasma in the processing vessel 1.

The RF power supply 23 can supply an RF power of 1 MHz to 200 MHz. In place of this power supply, a power supply which can mix powers having relatively low frequencies of several hundreds kHz to supply the mixed power may be used.

A pressure detector 51 for detecting a pressure in the processing vessel 1 is provided to the processing vessel 1. A detection signal from the pressure detector 51 is input to a controller 52. A control signal is output from the controller 52 to the exhaust unit 44 and the valve 43. By the pressure detector 51 and the controller 52, the pressure in the processing vessel 1 is controlled.

The operation of the plasma processing apparatus having the above arrangement will be described hereinafter.

First, the target object S is conveyed into a preliminary vacuum chamber (not shown) called a load-lock chamber before it is loaded into the processing vessel 1. The interior of the preliminary vacuum chamber is set at a predetermined vacuum atmosphere, e.g., $1 \times 10^{-2}$ Torr. This preliminary vacuum chamber and the processing vessel 1 can communicate with each other via the gate valve 18.

Before the processing vessel 1 communicates with the preliminary vacuum chamber, the interior of the processing vessel 1 is evacuated to set its interior at a predetermined pressure on, e.g., a $10^{-2}$ Torr order ($10^{-3}$ Torr<P<$10^{-1}$ Torr; P: pressure) while the gate valve 18 is kept closed.

Next, the target object S is loaded into the processing vessel 1 by a convey unit (not shown), e.g., a convey robot provided to the preliminary vacuum chamber, and then conveyed immediately above the electrostatic chuck 3. The three lift pins (not shown) are moved upward from the electrostatic chuck to receive the target object S thereon from the convey robot. When the lift pins are moved downward, the target object S is placed on the electrostatic chuck 3. In this state, the switch 7 is turned on, and a DC voltage of, e.g., 2 kV is applied from the DC power supply 8 to the electrostatic chuck 3 to electrostatically chuck the target object S.

At this time, an inert gas, e.g., an Ar (argon) gas supplied from the inert gas supply source 35 is introduced to the processing vessel 1 from the shower head 36 opposite to the target object S. The pressure in the processing vessel 1 is controlled at a predetermined vacuum pressure of, e.g., $1 \times 10^{-2}$ Torr by controlling the exhaust unit 44 and the valve 43 by the controller 52.

Then, an RF power of, e.g., 13.56 MHz is applied from the RF power supply 23 to the induction member 21, and a plasma of the inert gas is generated in the processing vessel 1 due to an alternating electric field formed in the processing vessel 1 by electromagnetic induction at that time. The plasma of the inert gas is continuously generated for a predetermined time, e.g., 1 to 120 sec. Thereafter, the introduction of the inert gas and the application of the RF voltage with respect to the induction member 21 are stopped to stop the generation of the plasma. The plasma of the inert gas is generated for a short period of time prior to generation of a plasma of a processing gas, so the rise of the plasma of the processing gas can be stabilized, and the plasma can be easily generated at a low pressure on a $10^{-3}$ Torr order to a $10^{-6}$ Torr order. An experiment by the present inventors confirmed that a plasma of a processing gas is easily generated even if the processing apparatus is left unchanged in a plasma stop state upon the generation of the plasma of the inert gas.

The reason why the plasma of the processing gas is easily generated is as follows. That is, the temporary generation of the plasma of the inert gas allows electrical conditions of the target surface of the target object S, the inner wall surface of the processing vessel 1, the exposed surface of the table 2, the surface of the focus ring 14, and the like to facilitate the generation of the plasma of the processing gas.

It is not preferable that the generation time of the plasma of the inert gas be long. Several seconds, e.g., 1 to 3 sec are preferred. This is because, if the plasma is generated for a long period of time, unnecessary processing is performed on the target object.

The pressure in the processing vessel 1 in the generation of the plasma of the inert gas is preferably 1 mTorr to 100 mTorr. At such a pressure, the plasma of the inert gas is easily generated.

After the plasma of the inert gas is stopped, a processing gas, e.g., a $CHF_3$ etching gas is introduced from the processing gas supply source 34 to the processing vessel 1 via the shower head 36. The pressure in the processing vessel 1 is controlled at a predetermined vacuum pressure of, e.g., $1 \times 10^{-3}$ Torr by controlling the exhaust unit 44 and the valve 43 by the controller 52.

The processing gas is not limited to an etching gas. A CVD gas, a sputtering gas, an ion-implantation gas, or the like is properly selected as a processing gas in accordance with the type of processing.

Then, an RF voltage of, e.g., 13.56 MHz is applied from the RF power supply 23 to the induction member 21, and a plasma of the processing gas is generated in the processing vessel 1 due to an alternating electric field formed in the processing vessel 1 by electromagnetic induction at that time. The pressure in the processing vessel 1 is preferably $1 \times 10^{-6}$ Torr to 10 mTorr, and more preferably $5 \times 10^{-4}$ Torr to 10 mTorr.

An RF power having a frequency selected from a frequency band of 100 kHz to 20 MHz, e.g., an RF power of 400 kHz is applied from the RF power supply 11 to the table 2.

At this time, a back cooling gas, e.g., an He gas is supplied to the lower surface side of the target object S via the gas supply pipe 16 and the through hole 15 to enhance heat transfer. With this operation, heat of the table 2 is efficiently transferred to the target object S to set the target object S at a predetermined processing temperature.

In this manner, the plasma of the processing gas is generated for a predetermined period of time to perform predetermined processing on the target object S.

At the end of the plasma processing with respect to the target object S, the supply of the processing gas and the application of the RF voltage to the induction member 21 and the table 2 are stopped.

The supply of the back cooling gas to the lower surface of the target object, and the voltage application to the electrostatic chuck 3 are stopped as well.

Thereafter, the target object S is unloaded from the processing vessel 1. First, the interior of the processing vessel 1 is evacuated to a predetermined vacuum pressure by the exhaust unit 44. With this operation, the processing gas and reaction products in the processing vessel 1 are exhausted from the processing vessel 1. An inert gas, e.g., an $N_2$ (nitrogen) gas is supplied from the shower head 36, and the processing vessel 1 is set at a predetermined pressure of, e.g., $1 \times 10^{-2}$ Torr, which is the same as or a slightly negative pressure with respect to the pressure in the preliminary vacuum chamber. The gate valve 18 is opened. Then, the target object S lifted by the lift pins (not shown) is held by the convey unit (not shown), and conveyed in the preliminary vacuum chamber.

The plasma processing is finished by the above series of steps.

The above description exemplifies a case in which the processing gas is introduced upon the complete stop of the plasma of the inert gas to generate a plasma of the processing gas. This method has the following advantages. That is, since the vacuum pressure in the introduction of the processing gas can be set at a processing pressure in the generation of a plasma of the processing gas regardless of the vacuum pressure in the introduction of the inert gas, the rise of a plasma of the processing gas can be easily stabilized. In addition, since the processing pressure does not vary, the stable processing results between the target objects can be uniformed.

In contrast to this, to achieve further stabilization of the rise of a plasma of the processing gas, the processing gas can be introduced to generate a plasma of the processing gas before a plasma of the inert gas is stopped. In this manner, a time zone in which generation of the plasma of the inert gas overlaps that of the plasma of the processing gas can be set. That is, the ratio of the introduced gas can be sequentially changed from 100% of the inert gas to 100% of the processing gas to change the plasma of the inert gas to the plasma of the processing gas. In this case, as in the first case, the inert gas is introduced prior to the introduction of the processing gas to generate a plasma, thereby easily rising the plasma of the processing gas in a low pressure range on a $10^{-3}$ Torr order to a $10^{-6}$ Torr order.

The experiment confirms that a plasma of an inert gas sufficiently contributes to the rise of a plasma of a processing gas even if the pressure in a processing vessel is on a $10^{-2}$ Torr order, and the generation time of the plasma of the inert gas is several seconds. According to another experiment, after a plasma of an inert gas was generated at a vacuum pressure on a $10^{-2}$ Torr order for several seconds, the introduction of the inert gas to the processing vessel 1 was stopped. The interior of the processing vessel 1 was evacuated to a predetermined pressure on, e.g., a $10^{-3}$ Torr order. After about 30 min elapsed at this pressure, a processing gas was introduced to rise a plasma. This experiment also confirms that a plasma can be generated very easily.

Figure 6:
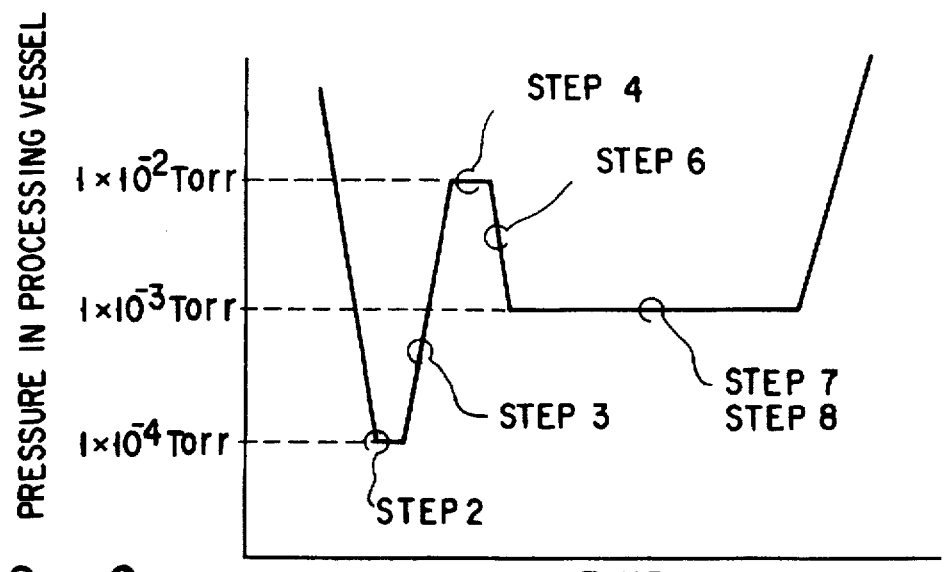
FIG. 6 is a graph showing a change in pressure in a processing vessel obtained when the plasma processing method of the present invention is practiced.

A detailed flow in practicing the first embodiment of the plasma processing method by using the apparatus shown in FIG. 1 is shown in a flow chart of FIG. 5 in order. FIG. 6 is a graph showing a change in pressure the processing vessel 1 obtained when a process shown in the flow chart of FIG. 5 is performed.

Steps in FIG. 5 are as follows.

Step 1: a target object S is loaded into the processing vessel 1 and placed on the table 2.

Step 2: the gate valve 18 is closed, and the interior of the airtight processing vessel 1 is evacuated to a predetermined pressure of, e.g., $1\times10^{-6}$ Torr by the exhaust unit 44.

Step 3: an inert gas, e.g., an Ar (argon) gas is introduced from the inert gas supply source 35 to the processing vessel 1, and the interior of the processing vessel 1 is evacuated to a predetermined pressure of, e.g., $1\times10^{-2}$ Torr.

Step 4: an RF voltage is applied from the RF power supply 23 to the induction member 21 to generate a plasma of the inert gas for several seconds.

Step 5: the introduction of the inert gas is stopped, and at the same time the application of the RF voltage is stopped.

Step 6: a processing gas, e.g., a $CHF_3$ gas is introduced from the processing gas supply source 34 to the processing vessel 1, and the processing vessel 1 is set at a predetermined pressure of, e.g., $1\times10^{-3}$ Torr.

Step 7: an RF voltage is applied to the induction member 21 to generate a plasma of the processing gas in the processing vessel 1.

Step 8: predetermined processing, e.g., etching processing is performed on the target object S using the plasma of the processing gas.

Step 9: the introduction of the processing gas is stopped, and at the same time the application of the RF voltage is stopped.

In the above process, the plasma of the inert gas is generated for several seconds in step 4. After the generation of this plasma is stopped, the plasma of the processing gas is generated in step 7. In step 8, the plasma processing is performed for, e.g., 60 sec to 120 sec.

This plasma processing method has the following advantages. That is, first, a plasma of the processing gas is easily risen, and the generation of a plasma can be stabilized, as described above. Second, since the introduction of the inert gas is stopped upon the generation of a plasma of the inert gas, the processing gas is not diluted because no inert gas is mixed in the processing gas. Therefore, uniform plasma processing can be performed.

Next, the second embodiment of the plasma processing method will be described in detail.

As described above, in the plasma processing apparatus using the induction means, the vacuum pressure capable of generating a plasma falls within a wide range of several Torr to $1\times10^{-6}$ Torr. At a pressure lower than $1\times10^{-3}$ Torr, however, a plasma is hardly risen by introducing the processing gas. For this reason, according to the present invention, after a plasma of the inert gas is generated at a relatively high pressure, e.g., a predetermined pressure within a range of several Torr to $1\times10^{-3}$ Torr, a plasma of the processing gas is formed. In this case, as in the first embodiment, if the processing gas for a plasma is introduced upon the stop of supply of the inert gas, the processing gas is not diluted with the inert gas. Therefore, further uniform plasma processing can be performed.

On the contrary, the processing gas is introduced in a plasma generation state using the inert gas, and the atmosphere in the processing vessel 1 is sequentially substituted with a plasma of the processing gas. At the same time, the pressure in the processing vessel 1 is set at a predetermined processing pressure of, e.g., $1\times10^{-4}$ Torr. With this operation, even if the processing gas is diluted with the inert gas, the plasma of the processing gas is relatively easily risen to process a target object with a plasma.

Figure 7:
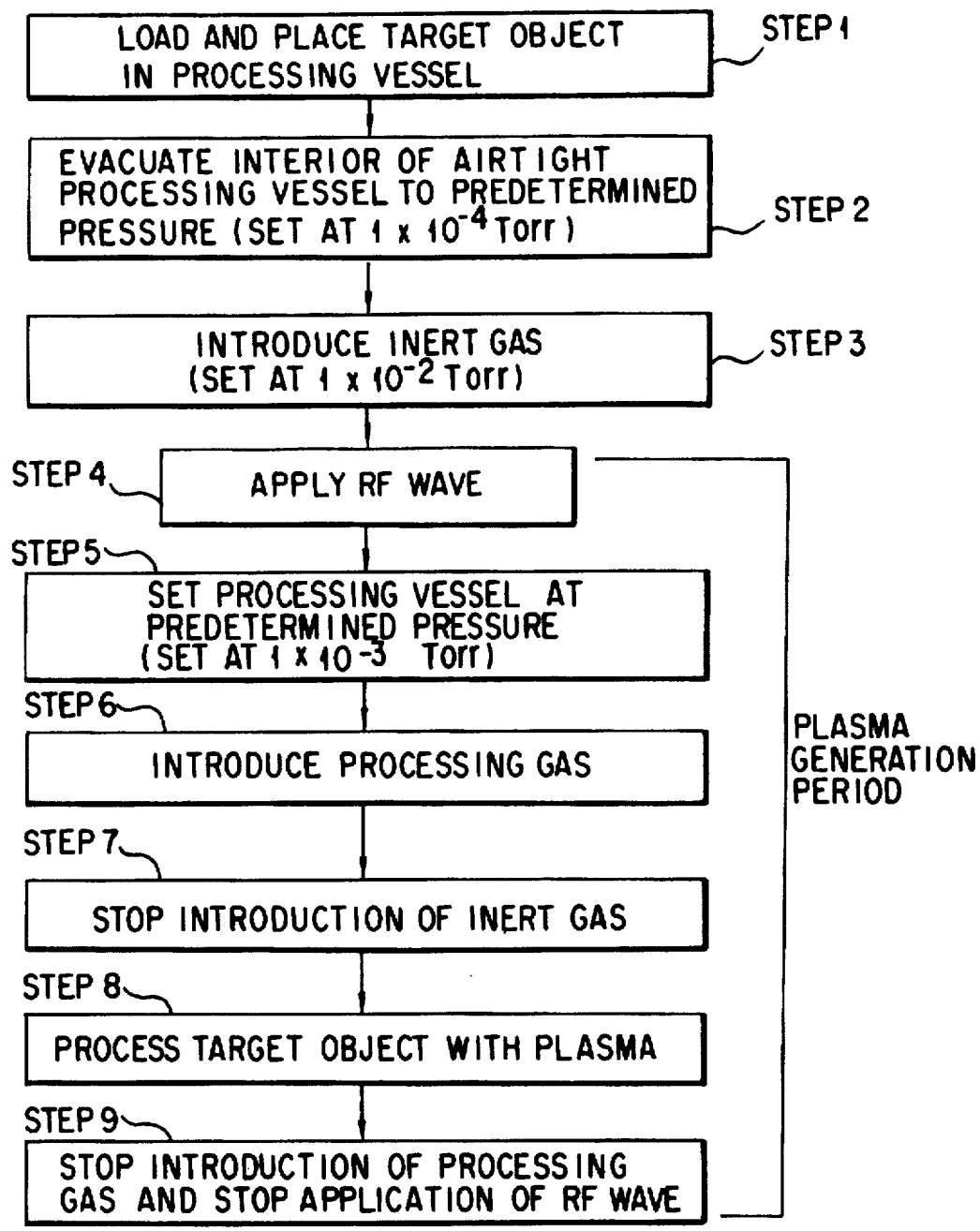
FIG. 7 is a flow chart showing another embodiment of a plasma processing method of the present invention.

The method of this embodiment will be shown in a flow chart of FIG. 7.

This case will be described using the plasma apparatus shown in FIG. 1.

In the flow chart for the first embodiment shown in FIG. 5, after a plasma of the inert gas is generated, the plasma is temporarily stopped. In contrast to this, in the flow chart for the second embodiment shown in FIG. 7, after an RF voltage is applied to generate a plasma of an inert gas in step 4, a processing gas is introduced in step 6 while keeping this plasma.

Meanwhile, in step 5, the interior of the processing vessel 1 is evacuated to a predetermined pressure for performing plasma processing using the processing gas while keeping the plasma of the inert gas. For this reason, when the processing gas is to be introduced in step 6, the processing vessel 1 is set at a predetermined pressure of, e.g., $1\times10^{-3}$ Torr.

Since a pressure at the start of plasma processing using the processing gas does not vary, and a plasma can be stably generated through these steps, the processing can be stabilized. After the processing gas is introduced, the introduction of the inert gas is stopped in step 7, thereby generating a plasma of the 100% processing gas. Since a plasma generated in the processing vessel is switched to a plasma of the processing gas without any interruption, the dilution of the processing gas with the inert gas is arbitrarily changed to select desired plasma processing, which is the advantage of the second embodiment.

In the above plasma processing, an Ar (argon) gas, an Xe (xenon) gas, a Kr (krypton) gas, an He (helium) gas, or an $N_2$ (nitrogen) gas can be properly selected as an inert gas in accordance with the type of processing gas.

The plasma processing comprises etching processing, film formation processing, ashing processing, or the like. The processing gas can be properly selected in accordance with target processing contents.

Typical plasma processing and a typical processing gas will be described below in detail.

For example, when a liquid crystal display device in which a liquid crystal sealed between pixel electrodes and a counter electrode is turned on/off by driving thin film transistors to perform a display operation is to be manufactured, a film for forming the thin film transistor is formed on a glass substrate. The plasma processing method of the present invention can be applied to this film formation. The types of films and the types of processing gases are shown in table 1.

TABLE 1

| Type of Film | Type of Processing Gas |
|---|---|
| Amorphous silicon film (a-Si) | $SiH_4 + H_2$ |
| Amorphous silicon nitride film (a-SiN) | $SiH_4 + NH_3$ |
| Silicon oxide film ($SiO_x$) | $SiH_4 + N_2 + O_2$ |

Etching targets of etching processing and the types of processing gases in steps of manufacturing the thin film transistor of the liquid crystal display device will be shown in table 2.

TABLE 2

| Etching Target | Type of Processing Gas |
|---|---|
| Aluminum (Al) | $Cl_2 + BCl_3$ |
| Amorphous ilicon (a-Si) | $CF_4$, $SF_6$, or a $Cl_2/SF_6$ mixture |
| Silicon nitride (SiN) | $SF_6$ |

In any of the above cases, an Ar gas is suitable for an inert gas which is used prior to generation of a plasma of the processing gas.

In this case, it is preferable to select an inert gas which does not adversely affect processing in accordance with the type of processing gas and processing contents performed by using a plasma.

A preferred embodiment in which the plasma processing method and the processing apparatus of the present invention are applied to a cluster tool processing unit will be described below.

FIG. 8 is a schematic sectional view showing a cluster tool processing unit.

A convey unit 101 for conveying a target object is arranged in an airtight common convey chamber 100.

The common convey chamber 100 has a rectangular shape, and openable gate valves 102, 103, and 104 are arranged in the three side walls thereof. Air-tight processing vessels 105, 106, and 107 are connected to the side walls in which the gate valves 102, 103, and 104 are arranged. These processing vessels 105, 106, and 107 are radially arranged around the common convey chamber 100. The common convey chamber 100 can selectively communicate with the processing vessels 105, 106, and 107 via the gate valves 102, 103, and 104.

Each of the processing vessels 105, 106, and 107 has the above induction means, by which a plasma is generated to process a target object. Therefore, induction members 108, 109, and 110 each consisting of a planar coil are provided at the central portions of the processing vessels 105, 106, and 107.

All the processing vessels 105, 106, and 107 need not have the induction means, and at least one of these processing vessels 105, 106, and 107 has the induction means. A conventional parallel-plate plasma processing unit which is often used, a thermal CVD unit, an ECR plasma processing unit, a sputtering unit, an ashing unit, an etching unit, and the like can be installed in the remaining processing vessels in correspondence with target processing contents, as a matter of course.

The communication between the processing vessels 105, 106, and 107 and the common convey chamber 100 is performed by using the gate valves 102, 103, and 104. Opening of the gate valves 102, 103, and 104 are controlled such that processing in each processing vessel does not affect a target object subjected to another processing.

In the processing vessels 105, 106, and 107, the same processing can be performed on a plurality of target objects at the same time. Alternatively, the same target object can be sequentially loaded/unloaded into/from the processing vessels 105, 106, and 107 in this order to perform a series of processing.

A detailed example of this series processing comprises a case in which a glass substrate available from Corning is used as a target object, and a three-layered structure consisting of an a-Si film (amorphous silicon film), an SiN film (silicon nitride film), an $n^+$-type a-Si film is formed thereon to manufacture a thin film transistor. That is, plasma CVD units for forming films are respectively installed in the processing vessels 105, 106, and 107, and the film formation processing is sequentially performed. An induction means is used for a plasma source of each plasma CVD unit, thereby uniformly processing a target object having a large area with a plasma.

It is preferable that the pressure in the common convey chamber 100 is set higher than the vacuum pressure in each of the processing vessels 105, 106, and 107. With this arrangement, a processing gas in each processing vessel is prevented from adversely affecting the remaining processing vessels and the convey unit.

A gate valve 111 is arranged on one remaining side wall of the common convey chamber 100, and a preliminary vacuum chamber 112 is provided via the gate valve 111. By opening the gate valve 111, the preliminary vacuum chamber 112 can communicate with the common convey chamber 100.

Prior to processing in the processing vessels 105, 106, and 107, the preliminary vacuum chamber 112 performs preliminary heating processing of heating a target object to a predetermined temperature to shorten the processing time. In contrast, when a target object heated during processing in the processing vessels is to be stored in a cassette or placed at a predetermined position, the preliminary vacuum chamber 112 performs processing of cooling the target object to a predetermined temperature so as not to damage the contact portion due to the heat.

The preliminary vacuum chamber 112 is kept at a pressure higher than that in the processing vessel 105, 106, or 107, or the common convey chamber 100, e.g., at a pressure on a $10^{-3}$ Torr order to a $10^{-2}$ Torr order. As a preliminary heating means, heater utilizing heat generated by an electrical resistor provided to a table for a target object, or a lamp for directly heating a target object can be used. A cooling means comprises a means capable of cooling a target object to a predetermined temperature by circulating a refrigerant (e.g., an anti-freeze) or liquid nitrogen through a table for a target object. A chamber, in which preliminary heating and cooling stages are multilayered to set a plurality of target objects at predetermined temperatures, respectively, can be used as a preliminary vacuum chamber.

The convey unit 101 is arranged in the common convey chamber 100. The convey unit 101 conveys a target object between the preliminary vacuum chamber 112 and the processing vessels 105, 106, and 107.

A gate valve 113 is arranged on the side wall of the preliminary vacuum chamber 112 opposite to the gate valve 111 so as to oppose the gate valve 111. A second airtight convey chamber 114 is provided to communicate with the preliminary vacuum chamber 112 via the gate valve 113.

A gate valve 119 is arranged on the side wall of the second convey chamber 114 opposite to the gate valve 113 so as to oppose the gate valve 113. A cassette chamber 116 is provided to communicate with the second convey chamber 114 via the gate valve 119.

A second convey unit 115 is arranged in the second convey chamber 114 and conveys a target object between the preliminary vacuum chamber 112 and the cassette chamber 116.

A table (not shown) for placing at least one cassette 117 which can horizontally store a plurality of (e.g., 25) target objects is arranged in the cassette chamber 116. A gate valve 118 is arranged on the side wall of the cassette chamber 116 opposite to the gate valve 119 to communicate with the outside of the processing unit.

The operation of the cluster tool processing unit having the above arrangement will be described.

The cassettes in which target objects are stored are placed on the table provided at a predetermined position in the cassette chamber 116 by an automated guided system such as an automated guided vehicle (AGV) from another processing unit via the gate valve 118.

Next, the gate valve 118 is closed. The interior of the cassette chamber 116 is substituted with an inert gas, e.g., an $N_2$ gas. The gate valve 119 is opened, and the target objects in the cassette 117 are received one by one by the second convey unit 115 in the adjacent second convey chamber 114. The gate valve 113 is opened, and the received target object is conveyed to the preliminary heating means in the preliminary vacuum chamber 112 by the second convey unit 115.

The gate valve 113 is closed. The interior of the preliminary vacuum chamber 112 is evacuated to a predetermined pressure, and the target object is preliminarily heated. At the end of this heating processing, the gate valve 111 is opened, and the convey unit 101 enters the preliminary vacuum chamber 112 to receive the target object. The convey unit 101 conveys the target object to the common convey chamber 100, and the gate valve 111 is closed.

The conveyed target object is loaded from the common convey chamber 100 into the selected one of the processing vessels 105, 106, and 107 by the convey unit 101, and predetermined processing is performed. When the series processing is to be performed, processing is performed in the processing vessels in a predetermined order of processing.

In a course reverse to the above course, the target object on which the predetermined processing is finished is conveyed and stored in the predetermined cassette 117 in the cassette chamber 116.

By applying the processing method of the present invention to the cluster tool processing unit, the production efficiency can be greatly increased.

The above plasma processing method has a large effect when the induction means is used as a plasma generation means, and a plasma is generated by the induction means in the above embodiments. However, the plasma generation means is not limited to this, and another plasma generation means, e.g., a means, using a parallel-plate electrode, for applying an RF power to the parallel-plate electrode can be applied. Even in this case, the plasma of a processing gas can be stabilized.

Another embodiment of the present invention will be described hereinafter.

FIG. 9 is a schematic sectional view showing a film forming apparatus to which a plasma generating apparatus of this embodiment is applied. In FIG. 9, reference numeral 201 denote a processing vessel formed of, e.g., aluminum with an airtight structure. A wafer table 202 for placing a semiconductor wafer W as a target object is disposed at the center of the bottom of the processing vessel 201. A heater 203 for heating the wafer W to a predetermined temperature is arranged in the wafer table 202. One end of an RF power supply 241 for bias application is connected to the wafer table 202 via a matching circuit 242, and the other end of the RF power supply 241 is grounded.

A recessed portion 211 is formed on the upper wall of the processing vessel 201 opposite to the wafer table 202 such that a depth H1 of the recessed portion 211 is 5 cm, and a distance H2 between the bottom of the recessed portion 211 and the upper surface of the semiconductor wafer W placed on the wafer table 202 is 30 to 150 mm. The side and bottom walls of the recessed portion 211 are formed of a dielectric member 205 made of, e.g., quartz. A coiled induction member 206 is mounted on the bottom surface of the recessed portion 211. An RF power supply 271 for plasma generation is connected to two ends, i.e., inner and outer ends of the induction member 206 via a matching circuit 272. The induction member 206 can have the above planar coiled shape as shown in FIG. 3, or the above ring-like shape as shown in FIG. 4.

A gas supply pipe 212 for supplying a processing gas into the processing vessel 201 is connected to the upper portion of the side wall of the processing vessel 201, and an exhaust pipe 213 through which the interior of the processing vessel 201 is evacuated by an exhaust unit (not shown) is connected to the bottom of the processing vessel 201. Gate valves 214 and 215 which are opened/closed between the processing vessel 201 and a load-lock chamber (not shown) are provided to the side wall of the processing vessel 201.

The operation of plasma generation processing and plasma film formation processing according to this embodiment will be described with reference to FIG. 10.

First, a target object, e.g., the semiconductor wafer W is loaded from the load-lock chamber (not shown) into the processing vessel 201 via the gate valve 214 and placed on the wafer table 202. The wafer W is heated to a predetermined temperature by the heater 203. Also, a predetermined processing gas is supplied from the gas supply pipe 212 into the processing vessel 201 at a predetermined flow rate. The interior of the processing vessel 201 is evacuated to a predetermined vacuum degree by an exhaust unit (not shown) via the exhaust pipe 213. In this state, for example, a 13.56-kHz RF power of 500 W is supplied from the RF power supply 271 to the induction member 206.

With this operation, when an RF current flows through the induction member 206, alternating magnetic fields B are generated around the coiled induction member 206, as shown in the schematic view of FIG. 10. Most of their magnetic fluxes form a closed loop vertically extending through the central portion of the coiled induction member 206. In this embodiment, the induction member 206 is arranged in the recessed portion 211 formed on the upper wall portion of the processing vessel 201, and the side and bottom walls of the recessed portion 211 are constituted by a dielectric which passes through a magnetic field. With this arrangement, the alternating magnetic fields B are generated such that they pass through the sides of the recessed portion 211 using the coiled induction member 206 as the center. By such alternating magnetic fields, alternating electric fields E are circumferentially induced in an almost concentric shape with the coiled induction member 206 immediately below the induction member 206 in the processing vessel 201. In addition, other alternating electric fields E are induced to surround the induction member 206 in the side regions of the induction member 206. Electrons circumferentially accelerated by these alternating fields collide against neutrons of the processing gas to ionize the gas.

In this case, since the induction member 206 is arranged in the recessed portion 211 formed on the upper wall of the processing vessel 201, the outer side region of the induction member 206 is in a vacuum atmosphere in addition to the lower region thereof, so a plasma P is also generated in this outer side region. As a result, a high-density and uniform plasma can be generated in a horizontally wide region.

In a plasma CVD apparatus, gas molecule excited in an active state by a plasma react with each other, and their solid reaction products are deposited on the surface of a wafer to form a film. In the above apparatus of this embodiment, since a plasma acts on the entire surface of the semiconductor wafer W at a uniform density, a film is uniformly formed on the surface of the wafer.

The experiment which was performed to confirm the effect of the present embodiment will be described hereinafter. In the above plasma processing apparatus, a depth H1 (see FIG. 9) of a recessed portion was set to 80 mm; the diameter of the recessed portion, 160 mm; the thickness of a quartz plate, 8 mm; and the outer diameter of a coil as an induction member, 110 mm. A 13.56-kHz RF power of 500 W was applied from an RF power supply to generate a plasma. The electron density at a central portion $X_1$ of a processing vessel below the coil by 50 mm, and that at a point $X_2$ spaced apart outward from this central portion by 60 mm were measured to obtain the planar uniformity in electron density. An identical experiment was performed on a conventional apparatus which did not have a recessed portion. Note that, in the experiment of the conventional apparatus, a conventional plasma processing apparatus was virtually arranged such that the side wall of a recessed portion of a chamber was actually shielded by a grounded aluminum foil so as not to generate an electric field sideward from the recessed portion.

As a result, in the conventional apparatus, the electron density at the central portion was about $1 \times 10^{10}$ to $1 \times 10^{11}$ $cm^{-3}$, and the planar uniformity (i.e., a ratio of a difference between the electron densities $X_1$ and $X_2$ to the electron density $X_1$) at the central portion was $\pm 7$ to 8%. In the apparatus of the present invention, the electron density at the central portion was about $1 \times 10^{12}$ $cm^{-3}$, and the electron density distribution was $\pm 3\%$. It was confirmed that the electron density at the central portion in the apparatus of the present invention is 10 to 100 times higher than that in the conventional apparatus and the uniformity in electron density was greatly improved.

The reason why the electron density is so high in this embodiment is as follows.

As described above, only an alternating electric field immediately below the coil is effective for plasma formation in the conventional apparatus. In contrast, in the apparatus of the present invention, since the outer side region of the coiled induction member is also in a vacuum atmosphere, an alternating electric field in this region also contributes to an increase in electron density in the processing vessel.

The reason why the uniformity in electron density is realized in this embodiment is as follows.

When only an alternating electric field induced immediately below the coil is considered, the strength of the alternating electric field becomes lower outward from the peripheral edge portion of the coil. In this embodiment, the field strength at the peripheral portion of the coil is compensated by an alternating electric field in the outer side region of the coil. As a result, as shown in FIG. 11A, the plasma P is generated below and sideward from the recessed portion, obtaining a high-density and uniform plasma in the planar direction. Therefore, as shown in FIG. 11B, the uniformity in electron density distribution can be realized.

On the other hand, in the conventional apparatus, since no alternating electric field in the outer side region of the induction member contributes to the electron density in the chamber, the plasma P is formed only below the upper wall of the processing vessel, as shown in FIG. 12A. As indicated by a solid line in FIG. 12B, although the electron density is substantially uniform in a region corresponding to the central portion of the induction member, it is lowered outward from this region with a large gradient, and is the lowest particularly in the outer side region of the induction member where an alternating electric field is not induced.

The above experiment confirmed that the uniformity in electron density distribution is realized and the electron density is increased in the plasma film forming apparatus of this embodiment. Since the electron density and the plasma density have a proportional relationship, the experiment also exhibits that a high-density plasma is uniformly generated over a wide range. Actually, while keeping the pressure in the processing vessel at 10 mTorr, a TEOS gas, an $O_2$ gas, and an Ar gas were supplied into the processing vessel at a flow rate of 2, 10, or 20 sccm to form a thin film having a thickness of 10,000 Å. Under these conditions, the planar uniformity was as high as 3 to 4%.

In this manner, in the film forming apparatus of this embodiment, since a plasma is uniformly generated over a wide range, film formation processing can be uniformly performed over a wide area of the surface of a semiconductor wafer. Therefore, this apparatus can cope with an increase in diameter of the wafer size, and the yield can be increased. In addition, even if the sizes of the processing vessel and the induction member, and the electric energy are kept unchanged, the film formation rate increases because of a high generation density of a plasma, thereby increasing the throughput. A thin film containing little impurity can be formed. If the planar uniformity in thin film is set almost the same as that in the conventional apparatus, a coil can be downsized, and thus a quartz plate can be downsized and the electric energy can be decreased, realizing a decrease in cost.

The induction member has a ring-like shape in addition to a coiled shape, as described above. A two-turn coil 261 may be used as shown in FIG. 13, or a coil having the number of turns which is three or more may be used. As shown in FIG. 14, the edge of the recessed portion 211 formed on the chamber may be rounded. Alternatively, as shown in FIG. 15, it may be formed into a ring-like shape, a gas diffusion plate 262 may be arranged in its central space, and a gas supply pipe 212 may be provided to this portion. In this arrangement, a processing gas may be supplied into the chamber from the gas supply pipe 212. Further, part of the recessed portion 211 may consist of a grounded conductor to control the uniformity in plasma density.

If a coil as a coiled induction member is arranged in the processing vessel, the peripheral edge region at the side of the coil is also in a vacuum atmosphere, thereby generating a plasma in this region. In this case, however, when film formation processing is to be performed, a film is attached to this coil, which produces particles. When a corrosive processing gas is used for film formation processing, the coil is etched. For this reason, it is very difficult to actually apply this arrangement. In contrast to this, as in this embodiment, the arrangement in which the coil is provided outside the chamber has no such a problem, but advantageously facilitates maintenance.

The above description represents a case in which this embodiment is applied to the plasma film formation processing. However, the application is not limited to this, and this embodiment can be applied to, e.g., a plasma processing apparatus which performs plasma etching processing, plasma ashing processing, or the like. As an induction member, a member obtained by forming a conductor into a loop-like shape, a square shape, a one-turn shape, or a linear shape may be used in addition to the above planar coil.

According to this embodiment, since the plasma generation region can be set close to a target object by forming the recessed portion, the plasma processing rate can be increased.

Next, a pressure processing vessel which constitutes the above-described processing vessel or the above convey unit of the cluster tool processing unit will be described below.

In order to make this pressure processing vessel, the following methods are conventionally employed. According one method, a metal thick plate such as a very thick solid aluminum alloy is machined (boring) to shape a processing vessel. According to the other method, a metal plate member such as an aluminum alloy having a proper thickness is cut to prepare a bottom plate and a plurality of side plates which correspond to the surfaces of a circumferential plate. The bottom plate and the plurality of side plates are sequentially welded to each other to assemble a polygonal pressure processing vessel.

In the manufacture according to the former method of boring the plate, no problem is posed when a processing vessel is small. However, when the processing vessel is large, the material cost is high, and the machining processing is cumbersome. Further, many materials are wasted, and the manufacturing cost undesirably becomes very high.

For this reason, the latter method of assembling parts by welding, which is relatively advantageous in cost such as the material cost, is often used in a normal case. In this method, many parts and many manufacturing steps may be required. Furthermore, since many portions must be welded, the probability of leakage occurrence at the welded portions is high. In a welding operation, parts are heated to a high temperature due to welding heat to distort the parts, resulting in poor dimensional accuracy. In order to form a good high-vacuum state in the processing vessel, the inner surfaces of parts are planished by polishing or the like. However, these planished surfaces are deteriorated by the welding heat. Stable quality cannot be assured.

Recently, a polygonal pressure processing vessel constituted by one metal plate member is proposed. According to this method, one metal plate member is bent to form a plurality of surfaces of the processing vessel, thereby minimizing the number of parts, i.e., the number of welded portions. In this case, if a processing vessel is small, a thin metal plate member, which is easily bent, can be used. If a processing vessel is large, however, a thick metal plate member must be used from the viewpoint of the strength of the vacuum pressure resistance, as described above. It is very difficult to bent this thick metal plate member. Moreover, it is difficult to accurately match bending positions, causing a large dimensional error. When the plate is to be bent at a plurality of portions, positional matching becomes further difficult not to assure stable quality.

As a solution for this problem, a method of channeling a metal plate member to bend the plate at the channel is available. However, a bending stress concentrates at the bottom of the channel, and this may cause a bending loss and a decrease in strength.

A pressure processing vessel which solves the above problems will be described hereinafter with reference to FIGS. 16A to 18. An illustrated polygonal pressure processing vessel 320 is used for a large convey unit of a multichamber processing unit such as a cluster tool processing unit which has a large number of processing units.

Figure 16A:
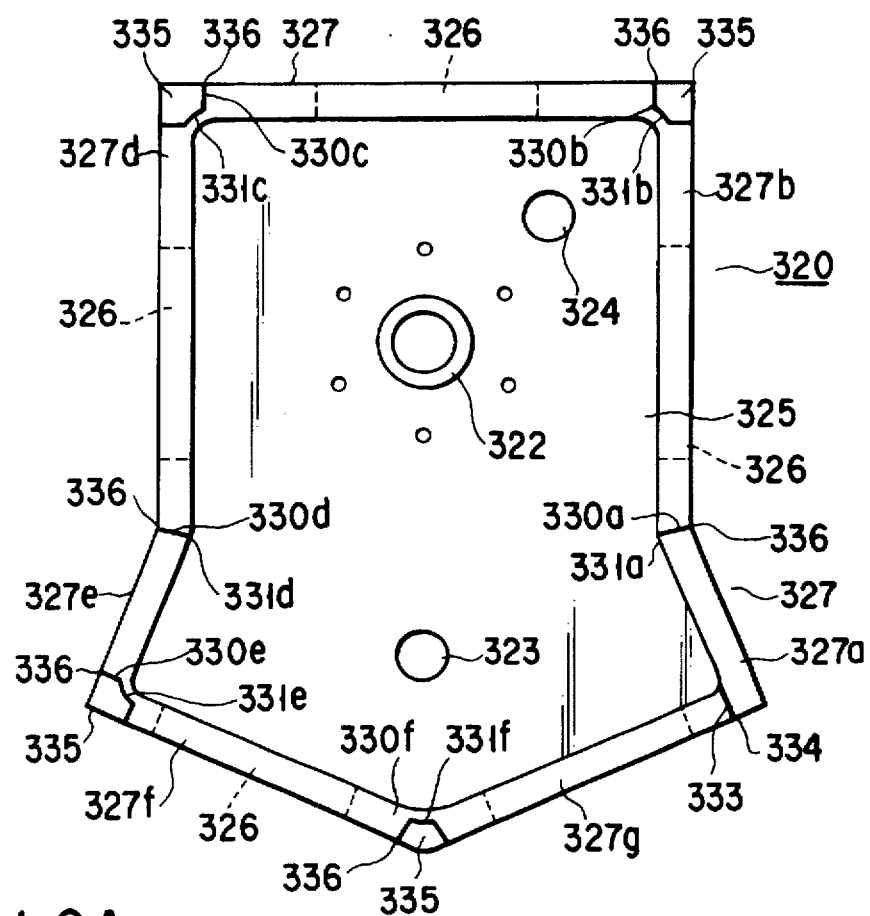
FIG. 16A is a plan view showing a polygonal pressure processing vessel used for a processing vessel or a convey chamber.
Figure 16B:
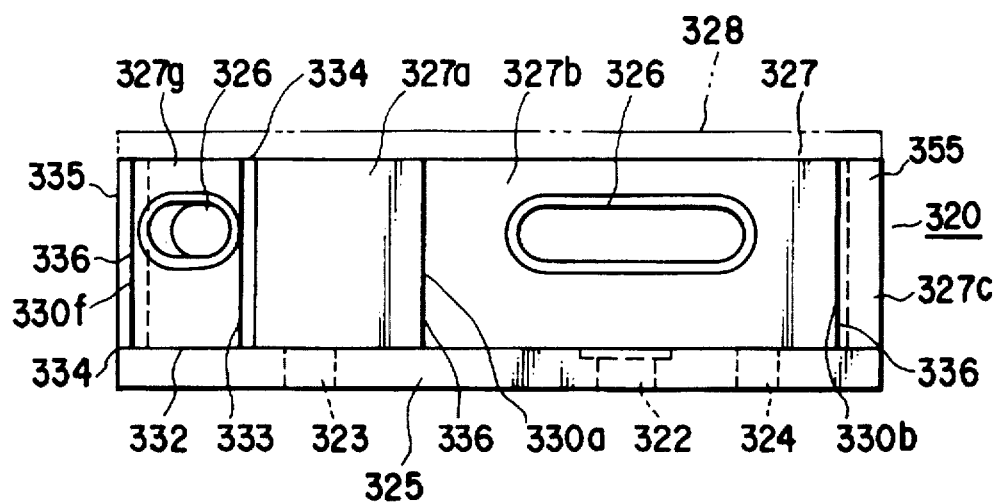
FIG. 16B is a side view showing the polygonal pressure processing vessel used for a processing vessel or a convey chamber.

As shown in FIGS. 16A and 16B, the polygonal pressure processing vessel 320 is arranged to have a polygonal shape with a bottom plate 325, and a circumferential plate 327 which stands at the peripheral edge of the bottom plate 325. Mounting ports 322, 323, and 324 for a convey arm, an alignment mechanism, a vacuum exhaust valve, and the like are formed in the bottom plate 325, and connection ports 326 each for air tightly connecting, e.g., each vacuum processing chamber and a loader chamber via a gate valve are formed in the circumferential plate 327. As shown in FIG. 16B, a top plate (opening/closing lid) 328 is fastened to the upper surface of the polygonal pressure processing vessel 320 via an O-ring (not shown) by a fastener to constitute a closed convey unit.

The polygonal pressure processing vessel 320 is a large processing vessel whose side is 1 m or more. In order to prevent a decrease in strength of the vacuum pressure resistance with an increase in size, a thick metal plate member, e.g., an aluminum alloy plate member having a thickness T of about 20 to 65 mm is used for the bottom plate 325 and the circumferential plate 327. A stainless steel plate member having a thickness of about 10 mm may be used.

Figure 17A:
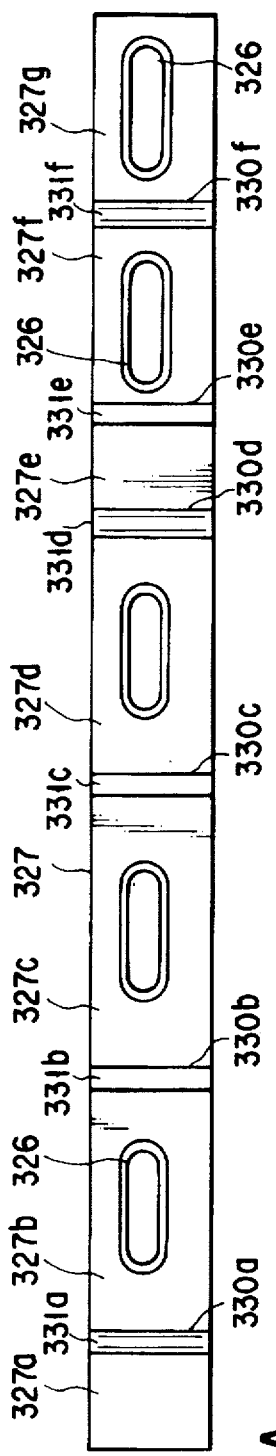
FIG. 17A is a side view showing a metal band member for forming a circumferential plate used in the polygonal pressure processing vessel.
Figure 18:
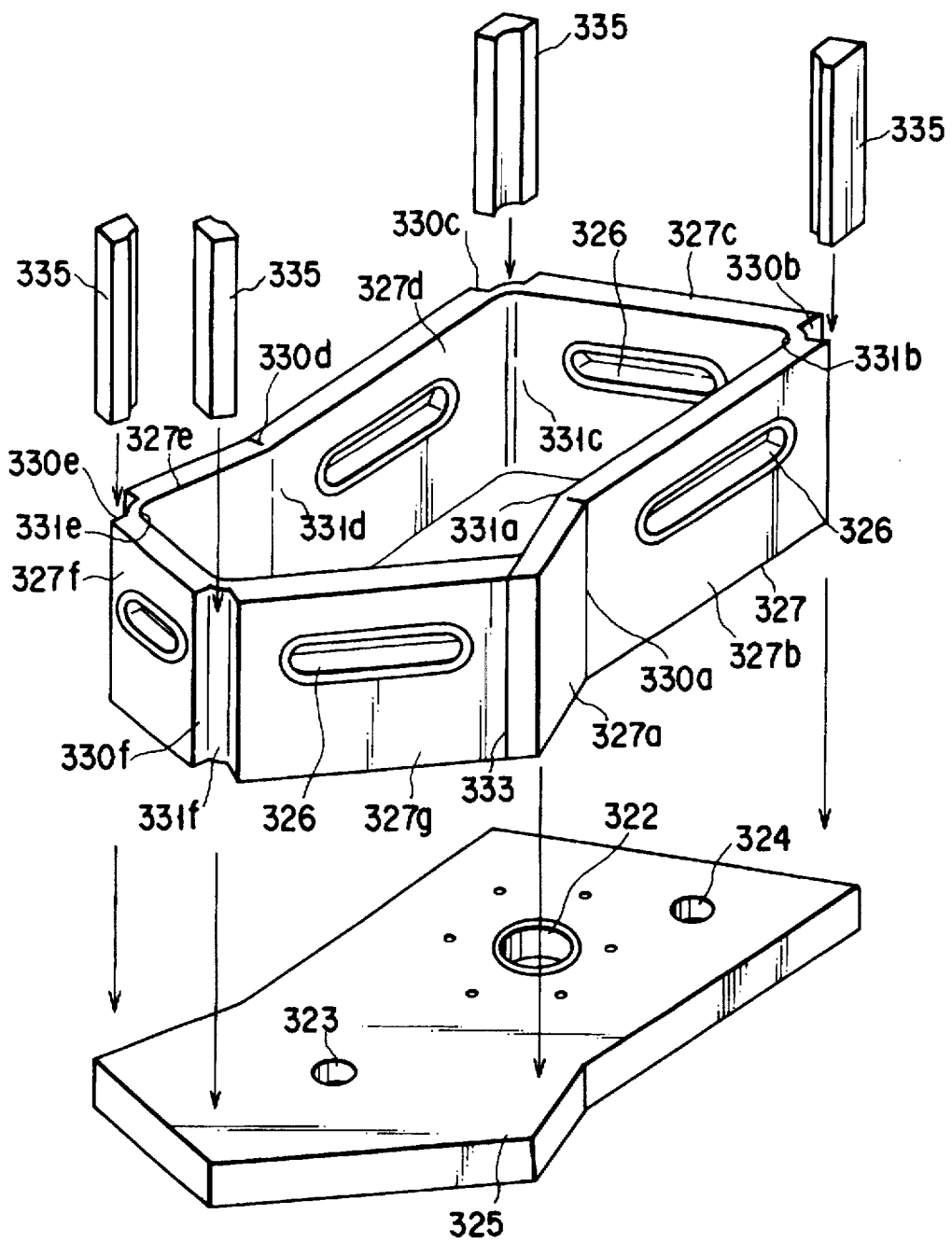
FIG. 18 is a perspective view showing an exploded state of parts before the polygonal pressure processing vessel is assembled.

As shown in FIG. 18, the bottom plate 325 is obtained by cutting one thick, flat metal plate consisting of, e.g., an aluminum alloy into a desired polygonal shape, and forming the mounting ports 322, 323, and 324 therein. The circumferential plate 327 has a polygonal shape shown in FIG. 18 with a series of required side plate portions 327a, 327b, 327c, 327d, 327e, 327f, and 327g, which are obtained by bending several times one elongated thick metal band member formed of, e.g., an aluminum alloy, as shown in FIG. 17A.

Figure 17B:
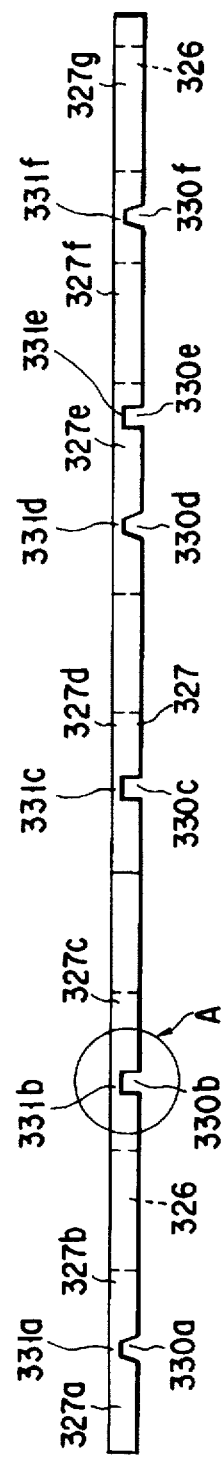
FIG. 17B is a plan view showing the metal band member for forming the circumferential plate used in the polygonal pressure processing vessel.

At that time, when the elongated metal band member used for the circumferential plate 327 consists of an aluminum alloy as described above, and has a thickness T of as large as about 20 to 65 mm, it is very difficult to bend this thick plate. For this reason, as shown in FIGS. 17A and 17B, a plurality of notched grooves 330a, 330b, 330c, 330d, 330e, and 330f are formed in the outer surface of the elongated metal band member in the longitudinal direction at intervals required for assuring the side plate portions 327a to 327g. Thin portions 331a, 331b, 331c, 331d, 331e, and 331f at the bottom surfaces of the notched grooves 330a to 330f are respectively bend to form a required annular polygonal shape as a whole.

Figure 17C:
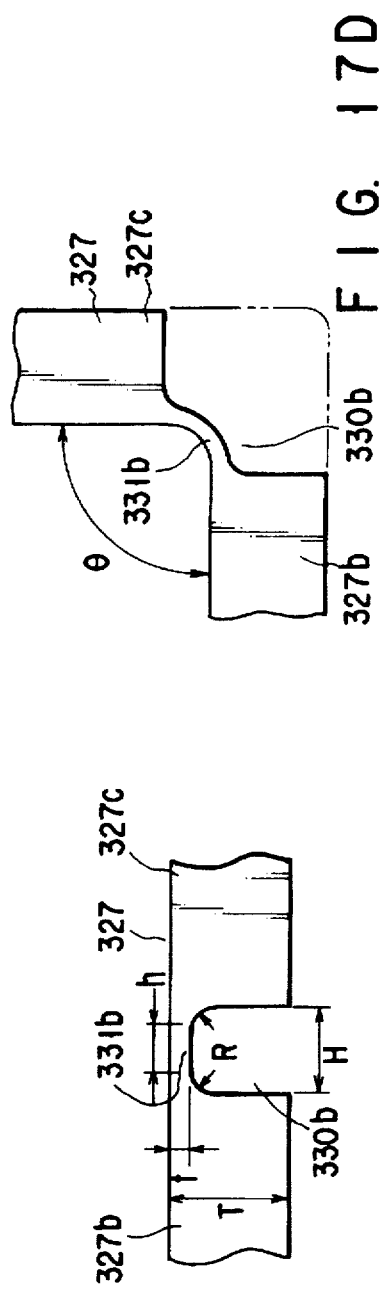
FIG. 17C is an enlarged view showing a portion A in FIG. 17B.
Figure 17D:
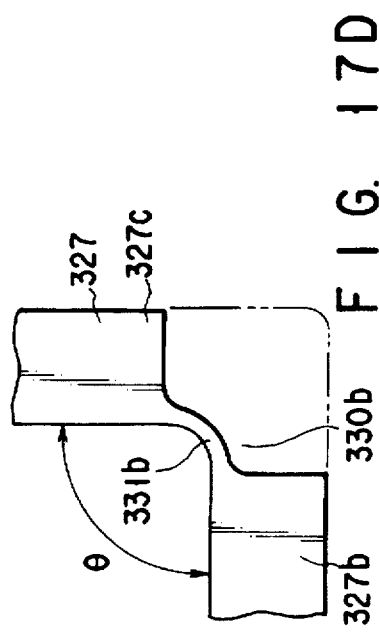
FIG. 17D is an enlarged view showing a bent state of the portion A.

As shown in FIGS. 17C and 17D, a groove width H of each of the notched grooves 330a to 330f is set large though the groove width H differs depending on bending angles θ at the respective bent portions. Two ends of each of the thin portions 331a to 331f at two end portions of the bottom surface of each groove are arcuately bent. With this arrangement, a bending loss and a decrease in strength caused by concentration of a bending stress on the bent portions can be minimized.

If the groove width H is too large, bent positions are not matched in bending the plate to degrade the dimensional accuracy of the polygonal shape. The groove width H is properly set in a relationship with a thickness t (groove depth) of each of the thin portions 331a to 331f at the bottom surfaces. For example, when a thickness T of an elongated aluminum alloy band member is about 20 to 65 mm, and the bending angle θ is 90°, the thickness t of each of the thin portions 331a to 331f at the bottom surfaces is set at about 1 to 5 mm, and the groove width H is about 5 to 15 mm. That is, a dimensional ratio of the thickness t of each thin portion at the bottom surface of each notched groove to the groove width H is preferably set within a range of 1:5 to 1:3. Each of two end portions R of the bottom in each of the notched grooves 330a to 330f has a radius of about 0.5 to 5 mm, and each of the thin portions 331a to 331f at the bottoms has a linear portion (uniform thin portion) h of at least about 1 to 10 mm. This linear portion h is arcuately bent to prevent the bending loss and decrease in strength caused by concentration of a bending stress on the two end portions of each of the thin portions 331a to 331f of the bottoms.

When the notched grooves 330a to 330f are to be formed in the elongated aluminum band member, the connection ports 326 each for airtightly connecting each vacuum processing chamber and a loader chamber via the gate valve 303 are also formed in required plates of the side plate portions 327b, 327c, 327d, 327f, and 327g between the notched grooves 330a to 330f. At the same time, the entire inner surface of the elongated aluminum band member is planished by polishing or the like. In this state, the thin portions 331a to 331f at the bottom surfaces of the notched grooves 330a to 330f are respectively bent to obtain a required annular polygonal circumferential plate 327 for the polygonal pressure processing vessel as a whole.

The polygonal circumferential plate 327 is joined with one thick metal bottom plate 325. A joint portion 332 between the circumferential plate 327 and the bottom plate 325, and two end joint portions 333 of the circumferential plate 327 are airtightly and entirely brazed by inserting brazing members 334 which are made of, e.g., an alloy of aluminum, magnesium, and silicon. With this operation, the polygonal pressure processing vessel 320 can be manufactured.

Further, to reinforce the circumferential plate 327, metal reinforcing members 335 having a prismatic shape are fitted in the notched grooves 330b, 330c, 330e, and 330f via brazing members 336 which are the same as the brazing members 334. The metal reinforcing members 335 and the notched grooves 330b, 330c, 330e, and 330f are brazed. Each metal reinforcing member 335 is formed of the same material as the circumferential plate 327, e.g., an aluminum alloy.

The above brazing of the circumferential plate 327 and the above brazing between the circumferential plate 327 and the bottom plate 325 are performed as follows. That is, the brazing members 334 are inserted in the joint portions 332 and 333. The circumferential plate 327 and the bottom plate 325 are properly held by a fastener (not shown) and heated to a relatively low temperature (about 500° to 600° C.) in a vacuum chamber in this state. In the brazing operation of these joint portions, the prismatic metal reinforcing members 335 are fitted in the notched grooves 330b, 330c, 330e, and 330f via the brazing members 336, and the resultant structure is held by a fastener (not shown). With this operation, it is convenient that the metal reinforcing members 335 is simultaneously brazed.

In the polygonal pressure processing vessel 320 having the above arrangement and the manufacturing method thereof, the circumferential plate 327 bent polygonally and one bottom plate 325 are joined with each other, and the joint portion 332 between the circumferential plate 327 and the bottom plate 325 and the two end joint portions 333 of the circumferential plate 327 are airtightly and entirely brazed. Therefore, unlike the conventional method of boring a plate, the material cost can be greatly decreased, and cumbersome boring/cutting processing is not required. Since the number of parts is small, the number of steps of assembling and joining parts and the like can be decreased to facilitate the manufacture. A decrease in cost can also be realized. In addition, the number of joint portions by brazing is small, thus greatly decreasing the probability of leakage occurrence.

Since the circumferential plate 327 and the bottom plate 325 are airtightly joined with each other by brazing which can be performed at a relatively low temperature, the conventional welding operation is not required, thus reducing heat distortion of the circumferential plate 327 and the bottom plate 325. In order to realize the large polygonal pressure processing vessel 320, one thick metal band member is bent to obtain the polygonal circumferential plate 327. At that time, the wide notched grooves 330a to 330f are formed at the plurality of portions on the outer surface of the thick metal band member at intervals in the longitudinal direction, and the thin portions 331a to 331f at the bottom surfaces of the notched grooves 330a to 330f are arcuately bent, thereby realizing the required polygonal shape as a whole. With this arrangement, the bent positions are accurate, and the dimensional accuracy is hardly degraded. Furthermore, a bending loss and decreased in strength caused by concentration of a bending stress on the bent portions can be minimized. Therefore, the large polygonal pressure processing vessel 320 which is very stable, has high quality, and is excellent in strength of the pressure resistance can be realized.

The prismatic metal reinforcing members 335 are fitted via the brazing portions 336 in the notched grooves 330b, 330c, 330e, and 330f widened by bending the circumferential plate 327, and the resultant structure is brazed. With this structure, the channeled bent portions of the circumferential plate 327 can be reliably reinforced. The large polygonal pressure processing vessel 320 which is very stabler, has a higher quality, and is excellent in strength of the pressure resistance can be realized.

What is claimed is:

1. A plasma processing method of processing a target object arranged in a processing vessel with a plasma, comprising:

a first step of introducing an inert gas into said processing vessel at a pressure of 1 to 100 mTorr;

a second step of generating a plasma of the inert gas in said processing vessel;

a third step of stopping the plasma of the inert gas;

a fourth step of introducing a processing gas for processing said target object into said processing vessel at a pressure of $10^{-6}$ Torr to 10 mTorr, and wherein the pressure in said processing vessel in the fourth step is set lower than the pressure in said processing vessel in the first step; and a fifth step of generating a plasma of the processing gas in said processing vessel to process said target object.

2. The method according to claim 1, wherein the inert gas and the processing gas are introduced from a shower head which is arranged in said processing vessel to oppose said target object.

3. The method according to claim 1, wherein the plasmas are generated by induction means for forming an electric field in said processing vessel by electromagnetic induction in the second and fifth steps.

4. The method according to claim 3, wherein said induction means comprises a coiled induction member and an RF power supply for applying an RF wave to said induction member.

5. The method according to claim 1, wherein the inert gas is at least one type of gas selected from the group consisting of Ar (argon), Xe (xenon), Kr (krypton), He (helium), and $N_2$ (nitrogen).

6. A plasma processing method of processing a target object arranged in a processing vessel with a plasma, comprising:

introducing an inert gas into processing vessel at a pressure of 1 to 100 mTorr;

generating a plasma of the inert gas introduced into said processing vessel;

introducing a processing gas of processing said target object into processing vessel while keeping introduction of the inert gas and generation of the plasma after generating the plasma of the inert gas and at pressure of $10^{-6}$ Torr to 10 mTorr, and wherein the pressure in said processing vessel in said step of introducing the processing gas is set lower than the pressure in said processing vessel in the step of introducing the inert gas;

generating a plasma of the processing gas introduced into said processing vessel to process said target object; and stopping the introduction of the inert gas after the plasma of the processing gas is generated.

7. The method according to claim 6, wherein the inert gas and the processing gas are introduce from a shower head which is arranged in said processing vessel to oppose said target object.

8. The method according to claim 6, wherein the plasmas are generated by induction means for forming an electric field in said processing vessel by electromagnetic induction.

9. The method according to claim 8, wherein said induction means comprises a coiled induction member and an RF power supply for applying an RF wave to said induction member.

10. The method according to claim 8, wherein the inert gas is at least one type of gas selected from the group consisting of Ar (argon), Xe (xenon), Kr (krypton), He (helium), and $N_2$ (nitrogen).

* * * * *

UNITED STATES PATENT AND TRADEMARK OFFICE
CERTIFICATE OF CORRECTION

PATENT NO. : 5,783,492
DATED : July 21, 1998
INVENTOR(S) : Kimihiro HIGUCHI, et al.

It is certified that error appears in the above-identified patent and that said Letters Patent is hereby corrected as shown below:

ON THE TITLE PAGE:
Item [22], Application Filing Date should read

--Mar.3, 1995--

Signed and Sealed this

Twentieth Day of April, 1999

Attest:

Q. TODD DICKINSON

*Attesting Officer*     *Acting Commissioner of Patents and Trademarks*